United States Patent
Feng et al.

(10) Patent No.: US 11,974,464 B2
(45) Date of Patent: Apr. 30, 2024

(54) DRIVING BACKPLANE, DISPLAY PANEL AND DISPLAY APPARATUS

(71) Applicants: Hefei BOE Joint Technology Co.,Ltd., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); BOE TECHNOLOGY GROUP CO. LTD., Beijing (CN)

( * ) Notice: Subject to any disclaimer, the term of this patent is extended or adjusted under 35 U.S.C. 154(b) by 26 days.

(21) Appl. No.: 17/788,840

(22) PCT Filed: Feb. 18, 2021

(86) PCT No.: PCT/CN2021/076763
§ 371 (c)(1),
(2) Date: Jun. 24, 2022

(87) PCT Pub. No.: WO2022/174376
PCT Pub. Date: Aug. 25, 2022

(65) Prior Publication Data
US 2023/0345763 A1    Oct. 26, 2023

(51) Int. Cl.
*H01L 27/32* (2006.01)
*G09G 3/3233* (2016.01)
(Continued)

(52) U.S. Cl.
CPC ....... *H10K 59/1213* (2023.02); *G09G 3/3233* (2013.01); *G09G 3/3266* (2013.01);
(Continued)

(58) Field of Classification Search
CPC ............. H10K 59/1213; H10K 59/131; G09G 3/3233; G09G 3/3266; G09G 2300/0465;
(Continued)

(56) References Cited

U.S. PATENT DOCUMENTS

| 7,092,047 B2 | 8/2006 | Jeon |
| 2013/0127804 A1 | 5/2013 | Kim et al. |

(Continued)

FOREIGN PATENT DOCUMENTS

| CN | 204314570 U | 5/2015 |
| CN | 105093599 A | 11/2015 |

(Continued)

OTHER PUBLICATIONS

PCT International Search Report (with English translation) and Written Opinion for corresponding PCT Application No. PCT/CN2021/076763, dated Oct. 28, 2021, 10 pages.

(Continued)

*Primary Examiner* — Abdul-Samad A Adediran
(74) *Attorney, Agent, or Firm* — Dority & Manning, P.A.

(57) ABSTRACT

A driving backplane includes a base substrate, and data lines, a first gate line, a second gate line and pixel driving circuits that are disposed on the base substrate. The first gate line and the second gate line are adjacent. Each pixel driving circuit includes a first transistor including an active layer. The active layer includes an active portion, a first conductive portion and a second conductive portion. Active portions of first transistors further include first contact portions. The pixel driving circuits include a first pixel driving circuit and a second pixel driving circuit that are coupled to a data line and the first gate line. A first conductive portion in the first pixel driving circuit and a first conductive portion in the second pixel driving circuit are in contact through a first contact portion, and are coupled to the data line through the first contact portion.

20 Claims, 16 Drawing Sheets

(51) Int. Cl.
  *G09G 3/3266* (2016.01)
  *H10K 59/121* (2023.01)
  *H10K 59/131* (2023.01)

(52) U.S. Cl.
  CPC ... *H10K 59/131* (2023.02); *G09G 2300/0465* (2013.01); *G09G 2300/0842* (2013.01); *G09G 2310/0286* (2013.01)

(58) Field of Classification Search
  CPC ... G09G 2300/0842; G09G 2310/0286; G09G 3/3258
  See application file for complete search history.

(56) References Cited

U.S. PATENT DOCUMENTS

| | | | |
|---|---|---|---|
| 2014/0139771 A1 | 5/2014 | Choi | |
| 2016/0043055 A1 | 2/2016 | Song et al. | |
| 2017/0221979 A1* | 8/2017 | Chae | H10K 59/131 |
| 2017/0331061 A1 | 11/2017 | Lee et al. | |
| 2018/0190750 A1* | 7/2018 | Choi | H10K 59/1213 |
| 2018/0218684 A1* | 8/2018 | Choi | G09G 3/3258 |
| 2020/0202786 A1 | 6/2020 | Li et al. | |
| 2021/0183313 A1 | 6/2021 | Dong et al. | |
| 2021/0405486 A1 | 12/2021 | Zhao | |

FOREIGN PATENT DOCUMENTS

| | | |
|---|---|---|
| CN | 111413835 A | 7/2020 |
| KR | 200000059691 A | 10/2000 |
| KR | 100318540 B1 | 12/2001 |

OTHER PUBLICATIONS

Chinese Office Action (w/ English translation) for corresponding Chinese Patent Application No. 202180000221.7, dated Mar. 28, 2023, 18 pages.

* cited by examiner

DRIVING BACKPLANE, DISPLAY PANEL AND DISPLAY APPARATUS

CROSS-REFERENCE TO RELATED APPLICATION

This application is a national phase entry under 35 USC 371 of International Patent Application No. PCT/CN2021/076763 filed on Feb. 18, 2021, which is incorporated herein by reference in its entirety.

TECHNICAL FIELD

The present disclosure relates to the field of display technologies, and in particular, to a driving backplane, a display panel, and a display apparatus.

BACKGROUND

Pixels per inch (PPI), also referred to as a pixel density, means the number of pixels per inch in the display screen. Therefore, the higher the PPI value, the higher the density in which the display screen can display an image. Of course, the higher the density of the image displayed, the higher the simulation degree and the richer the details of the image will be.

SUMMARY

In an aspect, a driving backplane is provided. The driving backplane includes: a base substrate, a plurality of data lines disposed on the base substrate, a first gate line and a second gate line that are adjacent and disposed on the base substrate, and a plurality of pixel driving circuits disposed on the base substrate. Each pixel driving circuit includes a first transistor. The first transistor includes an active layer. The active layer includes an active portion, a first conductive portion and a second conductive portion; active portions of first transistors in the plurality of pixel driving circuits further include first contact portions. The plurality of pixel driving circuits include a first pixel driving circuit coupled to a data line and the first gate line, and a second pixel driving circuit coupled to the data line and the second gate line. A first conductive portion of a first transistor in the first pixel driving circuit and a first conductive portion of a first transistor in the second pixel driving circuit are in contact through a first contact portion of the first contact portions, and are coupled to the data line through the first contact portion.

In some embodiments, the plurality of pixel driving circuits include an active layer pattern, and the active layer of the first transistor belongs to the active layer pattern. The driving backplane further includes a first insulating layer disposed between the active layer pattern and the data lines, wherein the first insulating layer is provided with a plurality of first via holes. The first contact portion is coupled to the data line through a respective first via hole.

In some embodiments, an orthographic projection of at least one of the first gate line and the second gate line on a plane where a reference side face of the driving backplane is located does not overlap with an orthographic projection of the first contact portion on the plane where the reference side face of the driving backplane is located, and the reference side face of the driving backplane is a side face of the driving backplane parallel to the data line.

In some embodiments, a portion of the first gate line located between the first pixel driving circuit and the second pixel driving circuit, and a portion of the second gate line located between the first pixel driving circuit and the second pixel driving circuit are both straight lines.

In some embodiments, the first pixel driving circuit is mirror-symmetrical to the second pixel driving circuit with respect to a reference straight line, and the reference straight line is a line that is perpendicular to the data line and passes through first conductive portions of first transistors in the first pixel driving circuit and the second pixel driving circuit.

In some embodiments, each pixel driving circuit further includes a second transistor, the second transistor includes an active layer disposed in a same layer as the active layer of the first transistor, and the active layer of the second transistor includes an active portion, a first conductive portion and a second conductive portion; active portions of second transistors in the plurality of pixel driving circuits further include second contact portions. A first conductive portion of a second transistor in the first pixel driving circuit is in contact with a first conductive portion of a second transistor in the second pixel driving circuit through a second contact portion of the second contact portions, and the second contact portion is located between the first gate line and the second gate line.

In some embodiments, the plurality of pixel driving circuits include an active layer pattern, and the active layer of the first transistor belongs to the active layer pattern. The driving backplane further includes a first insulating layer disposed between the active layer pattern and the data lines, the first insulating layer is provided with a plurality of first via holes, and the first contact portion is coupled to the data line through a respective first via hole. The second transistor further includes a first electrode and a second electrode that are disposed in a same layer as the data lines. Each pixel driving circuit further includes a third transistor and a storage capacitor, the third transistor includes an active layer disposed in a same layer as the active layer of the first transistor, and a first electrode and a second electrode that are disposed in a same layer as the data lines; the active layer of the third transistor includes an active portion, a first conductive portion, and a second conductive portion; the storage capacitor includes a first electrode and a second electrode; the first electrode of the storage capacitor is located at a side of the active layer of the first transistor proximate to the base substrate. The first insulating layer is further provided with a plurality of second via holes, a plurality of third via holes, a plurality of fourth via holes, a plurality of fifth via holes, and a plurality of sixth via holes. The first electrode of the third transistor is connected to a power line in at least one power line, and is coupled to the first conductive portion of the third transistor through a second via hole, the second electrode of the third transistor is coupled to the second conductive portion of the third transistor through a third via hole. The first electrode of the second transistor is coupled to the first conductive portion of the second transistor through a fourth via hole, and the second electrode of the second transistor is coupled to the second conductive portion of the second transistor through a fifth via hole. The driving backplane further includes a second insulating layer disposed between active layers of first transistors and first electrodes of storage capacitors, the second insulating layer is provided with a plurality of seventh via holes, and each seventh via hole is communicated with a respective sixth via hole. The first electrode of the storage capacitor is coupled to a second electrode of a respective second transistor and/or a second electrode of a respective third transistor through both a sixth via hole and a seventh via hole communicated with the sixth via hole. An orthogonal projection of the sixth via hole on the base substrate does not overlap with orthogonal projections of the third via hole and the fifth via hole on the base substrate.

In some embodiments, the driving backplane further includes light-shielding patterns disposed on the base substrate; the first electrodes of the storage capacitors are transparent electrodes, the light-shielding patterns are disposed at a side of the first electrodes of the storage capacitors proximate to the base substrate, and are in direct contact with respective first electrodes of the storage capacitors.

In some embodiments, second electrodes of the storage capacitors in the plurality of pixel driving circuits are conductive patterns in a same layer as the active layer of the first transistor.

In some embodiments, the driving backplane further includes: a third pixel driving circuit and a fourth pixel driving circuit that are adjacent to the first pixel driving circuit in a direction along which the first gate line extends, a fifth pixel driving circuit adjacent to the third pixel driving circuit in the direction along which the first gate line extends, and a sensing signal line disposed between the third pixel driving circuit and the first pixel driving circuit. The data lines includes: a first data line and a second data line that are disposed between the first pixel driving circuit and the fourth pixel driving circuit, and a third data line and a fourth data line that are disposed between the fifth pixel driving circuit and the third pixel driving circuit, the sensing signal line is disposed in a same layer as the data lines. The first data line is coupled to the first conductive portion of the first transistor in the first pixel driving circuit, the second data line is coupled to a first conductive portion of a first transistor in the fourth pixel driving circuit, the third data line is coupled to a first conductive portion of a first transistor in the third pixel driving circuit, and the fourth data line is coupled to a first conductive portion of a first transistor in the fifth pixel driving circuit. The driving backplane further includes first connection lines in a same layer as the first electrode of the storage capacitor, and the first connection lines and the first gate line and/or the second gate line extending along a substantially same direction. The first insulating layer and the second insulating layer are further provided with a plurality of eighth via holes. In the first pixel driving circuit, the third pixel driving circuit, the fourth pixel driving circuit, and the fifth pixel driving circuit, first electrodes of second transistors are each coupled to a respective first connection line through an eighth via hole, and the sensing signal line is in contact with first electrodes of second transistors in the first pixel driving circuit and the third pixel driving circuit.

In some embodiments, the at least one power line includes at least two power lines, the at least two power lines are disposed in a same layer as the data lines, and the at least two power lines and the data lines extend along a same direction. The at least two power lines include a first power line disposed at a side of the fourth pixel driving circuit away from the first pixel driving circuit, and a second power line disposed at a side of the fifth pixel driving circuit away from the first pixel driving circuit. The driving backplane further includes second connection lines disposed in a same layer as the first gate line and the second gate line, wherein a second connection line is coupled to first electrodes of third transistors in the first pixel driving circuit, the third pixel driving circuit, the fourth pixel driving circuit and the fifth pixel driving circuit. The first power line is in contact with a first electrode of a third transistor in the fourth pixel driving circuit, and the second power line is in contact with a first electrode of a third transistor in the fifth pixel driving circuit.

In some embodiments, an orthographic projection of a portion of the fourth pixel driving circuit where a first conductive portion of the third transistor is coupled to a first electrode of the third transistor on the base substrate is located between orthographic projections of the first power line and the second connection line on the base substrate, and an orthographic projection of a portion of the fifth pixel driving circuit where a first conductive portion of the third transistor is coupled to a first electrode of the third transistor on the base substrate is located between orthographic projections of the second power line and the second connection line on the base substrate. Orthographic projections of portions of the first pixel driving circuit and the third pixel driving circuit where first conductive portions of third transistors are each coupled to a first electrode of a respective third transistor on the base substrate are located at a side of the second connection line proximate to the first gate line.

In some embodiments, the third transistor further includes a gate electrode disposed in the same layer as the first gate line and the second gate line. Second electrodes of the storage capacitors in the plurality of pixel driving circuits are conductive patterns in a same layer as the active layer of the first transistor, a conductive pattern includes a portion disposed at a side of the second connection line proximate to the first gate line, and a portion disposed at a side of the second connection line away from the first gate line. The portion of the conductive pattern disposed at the side of the second connection line proximate to the first gate line is coupled to the gate electrode of the third transistor and the second electrode of the first transistor. The driving backplane further includes first conductive patterns disposed in a same layer as the data lines and coupled to respective second electrodes of the first transistors. An orthographic projection of a first conductive pattern on the base substrate is located at the side of the second connection line away from the first gate line, and the first conductive pattern is coupled to the portion of the conductive pattern disposed at the side of the second connection line away from the first gate line through a via hole disposed in the first insulating layer.

In some embodiments, the driving backplane further includes two second conductive patterns and a third conductive pattern that are disposed in a same layer as the first gate line and the second gate line. One of the two second conductive patterns is coupled to the first power line, another second conductive pattern is coupled to the second power line, and the third conductive pattern is coupled to the sensing signal line.

In some embodiments, the first pixel driving circuit and the third pixel driving circuit are mirror-symmetrical with respect to the sensing signal line, and the fourth pixel driving circuit and the fifth pixel driving circuit are mirror-symmetrical with respect to the sensing signal line.

In some embodiments, the driving backplane further includes a gate driver circuit. Each pixel driving circuit belongs to a respective sub-pixel of a plurality of rows of sub-pixels of the driving backplane. The gate driver circuit includes a plurality of shift registers that are cascaded. Each shift register includes at least one thin film transistor group, each thin film transistor group includes at least one thin film transistor. At least one thin film transistor group in the gate driver circuit is disposed between adjacent sub-pixels or adjacent display units in a same row of sub-pixels, and each display unit includes at least two sub-pixels.

In some embodiments, the gate driver circuit further includes a plurality of control signal lines, at least part of the plurality of control signal lines are coupled to the shift register, and are configured to provide control signals to the shift register. A column of sub-pixels includes sub-pixels with a same ordinal value in the plurality of rows of sub-pixels. At least two control signal lines are disposed between adjacent columns of sub-pixels or between adjacent columns of display units, at least one sub-pixel or at least one display unit is disposed between any two of the at least two control signal lines, and each thin film transistor group and each control signal line are provided therebetween with at least one sub-pixel or at least one display unit.

In some embodiments, the gate driver circuit further includes a plurality of connection lines located between sub-pixels in two adjacent rows or display units in two adjacent rows. At least two thin film transistor groups are coupled through a respective connection line; or the control signal line is coupled to at least one thin film transistor group through a respective connection line. Shift registers in two adjacent rows share at least one of the plurality of connection lines.

In another aspect, a display panel is provided. The display panel includes the driving backplane described above, and driven devices. Each pixel driving circuit is coupled to a respective driven device.

In some embodiments, the display panel is a top-emission display panel. Alternatively, the display panel is a bottom-emission display panel, and first electrodes of storage capacitors in pixel driving circuits in the driving backplane are transparent electrodes, and an orthographic projection of a first electrode of the first electrodes on the base substrate overlaps with an orthographic projection of a respective driven device on the base substrate.

In some embodiments, the first pixel driving circuit is mirror-symmetrical to the second pixel driving circuit with respect to a reference straight line in the driving backplane, a driven device in a sub-pixel to which the first pixel driving circuit belongs is disposed away from the first gate line and the second gate line with respect to the first pixel driving circuit, and a driven device in a sub-pixel to which the second pixel driving circuit belongs is disposed away from the first gate line and the second gate line with respect to the second pixel driving circuit.

In yet another aspect, a display apparatus is provided. The display apparatus includes the display panel described above.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Figure 1:
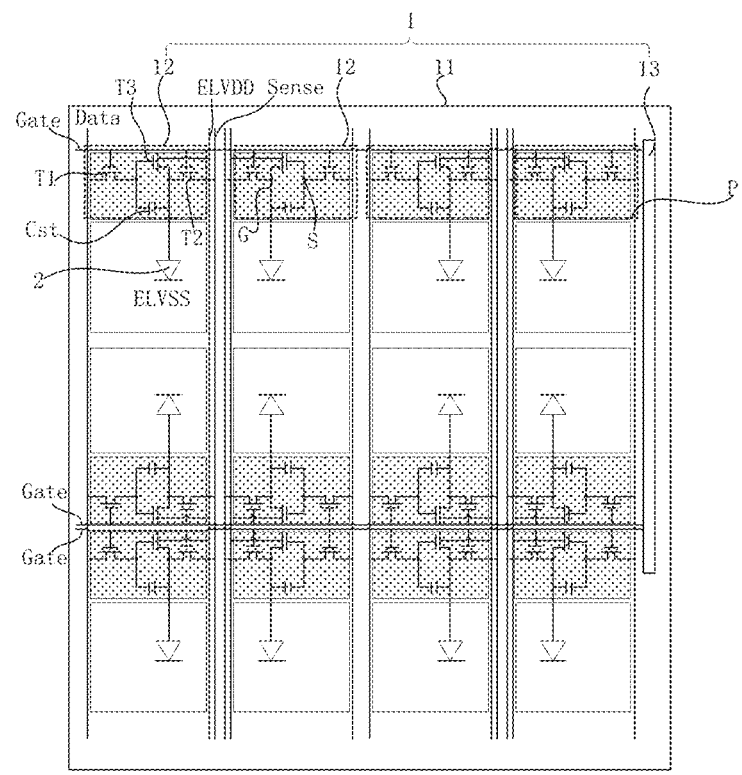
FIG. 1 is a top view showing a structure of a display panel, in accordance with some embodiments.

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "an example", "a specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials, or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, features defined with "first" or "second" may explicitly or implicitly include one or more of the features. In the description of the embodiments of the present disclosure, the terms "a plurality of", "the plurality of" and "multiple" each mean two or more unless otherwise specified.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of the phrase "applicable to" or "configured to" herein is meant an open and inclusive expression, which does not exclude devices that are applicable to or configured to perform additional tasks or steps.

In addition, the use of the phrase "based on" means openness and inclusiveness, since processes, steps, calculations or other actions "based on" one or more of the stated conditions or values may, in practice, be based on additional conditions or values exceeding those stated.

The terms such as "about" or "approximately" as used herein includes a stated value and an average value within an acceptable range of deviation of a particular value. The acceptable range of deviation is determined by a person of ordinary skill in the art, considering measurement in question and errors associated with measurement of a particular quantity (i.e., limitations of the measurement system).

As used herein, the term such as "first electrode" is, for example, a source electrode of a thin film transistor, and the term such as "second electrode" is, for example, a drain electrode of the thin film transistor, and vice versa.

As used herein, the same reference signs may denote signal lines and signal terminals, and may also denote signals corresponding to the signal lines and the signal terminals.

Exemplary embodiments are described herein with reference to sectional views and/or plan views as idealized exemplary drawings. In the accompanying drawings, thickness of layers and regions may be exaggerated for clarity. Therefore, variations in shape with respect to the drawings due to, for example, manufacturing technologies and/or tolerances may be envisaged. Therefore, the exemplary embodiments should not be construed as being limited to the shapes of the regions shown herein, but as including shape deviations due to, for example, manufacturing. For example, an etched region that is shown in a rectangle generally has a curved feature. Therefore, the regions shown in the accompanying drawings are schematic in nature, and their shapes are not intended to show actual shapes of the region in a device, and are not intended to limit the scope of the exemplary embodiments.

Some embodiments of the present disclosure provide a display apparatus. The display apparatus may be, for example, one of an organic light-emitting diode (OLED) display apparatus, a quantum dot light-emitting diode (QLED) display apparatus, a micro light-emitting diode (Micro-LED) display apparatus, a mini light-emitting diode (Mini-LED) display apparatus and the like.

Hereinafter, a structure of the display apparatus is described by taking an example in which the display apparatus is an OLED display apparatus.

The display apparatus includes, for example, a display panel. The display panel may have a display area and a non-display area. The non-display area may surround the display area.

In some embodiments, as shown in FIG. 1, the display panel may include a driving backplane 1 and driven device(s) 2. The driving backplane 1 may include a base substrate 11, and a plurality of data lines Data and a plurality of gate lines Gate disposed on the base substrate 11, and a plurality of pixel driving circuits 12 and a gate driver circuit 13 that are disposed on the base substrate 11. The gate driver circuit 12 is used for providing gate signals to the plurality of gate lines Gate. A plurality of driven devices 2 may be provided, and each driven device 2 may be coupled to a respective pixel driving circuit 12. The driven device 2 may be, for example, a light-emitting device, which emits light as driven by the respective pixel driving circuit 12.

Of course, the display panel may include other components besides the driving backplane 1 and the driven devices 2. For example, the display panel may include a control circuit for providing electrical signals to the driving backplane 1. The control circuit may include, for example, a circuit board electrically connected to the driving backplane 1 and/or an integrated circuit (IC) electrically connected to the driving backplane 1.

The pixel driving circuit 12 may be, for example, a 2T1C type pixel driving circuit, a 3T1C type pixel driving circuit, or a 7T1C type pixel driving circuit, in which T represents a thin film transistor (TFT), and C represents a storage capacitor. That is, the 2T1C type pixel driving circuit is a pixel driving circuit 12 including two TFTs and one storage capacitor Cst, and so forth. The embodiments of the present disclosure will be described below by taking an example in which the pixel driving circuit 12 is a 3T1C type pixel driving circuit.

Figure 2:
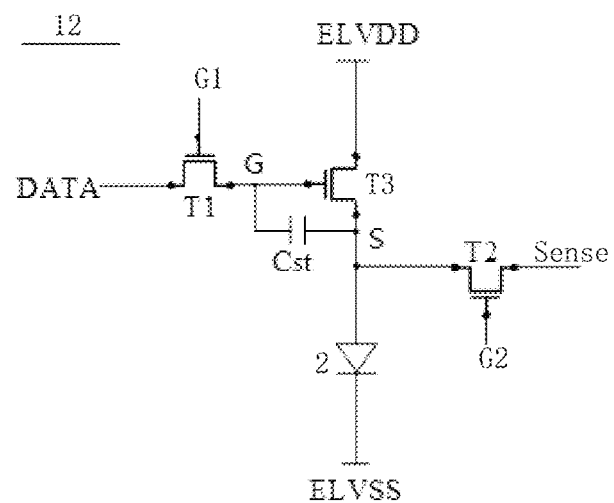
FIG. 2 is an equivalent diagram of a pixel driving circuit, in accordance with some embodiments.

Referring to FIGS. 1 and 2, the pixel driving circuit 12 includes a first transistor T1, a second transistor T2, a third transistor T3, and a storage capacitor Cst. The third transistor T3 is a driving transistor. A gate electrode of the first transistor T1 is coupled to a first gate signal terminal G1, a first electrode of the first transistor T1 is coupled to a data signal terminal DATA, and a second electrode of the first transistor T1 is coupled to a node G. A gate electrode of the second transistor T2 is coupled to a second gate signal terminal G2, a first electrode of the second transistor T2 is coupled to a sensing signal terminal Sense, and a second electrode of the second transistor T2 is coupled to a node S. A gate electrode of the third transistor T3 is coupled to the node G, a first electrode of the third transistor T3 is coupled to a power line ELVDD, and a second electrode of the third transistor T3 is coupled to the node S. An anode of the driven device 2 is coupled to the node S, and a cathode of the driven device 2 is coupled to a power supply voltage signal terminal ELVSS. One electrode of the storage capacitor Cst is coupled to the node G, and another electrode of the storage capacitor Cst is coupled to the node S. The first gate signal terminal G1 is configured to receive a first gate signal G1. The second gate signal terminal G2 is configured to receive a second gate signal G2. The data signal terminal DATA is configured to receive a data signal Data. The data signal Data includes, for example, a detection data signal $Data_1$ and a display data signal $Data_2$. The power line ELVDD is configured to receive a power supply voltage signal ELVDD, and the power supply voltage signal ELVDD is, for example, within a range of −5 V to 5 V. The power supply voltage signal terminal ELVSS is configured to receive a power supply voltage signal ELVSS, and the power supply voltage signal ELVSS is, for example, a constant voltage signal, such as a voltage signal less than or equal to 0 V. A sensing signal line Sense is configured to provide a reset signal and obtain a sensing signal Sense. The reset signal is used for resetting of the anode of the driven device 2, and the sensing signal is used for calculation of a threshold voltage of the third transistor T3.

When the pixel driving circuit 12 works in a blanking period of a frame, a working process of the pixel driving circuit 12 is, for example, as follows. The first transistor T1 is turned on under control of a first gate signal $G1_1$ provided at the first gate signal terminal G1, so as to transmit the detection data signal $Data_1$ from the data signal terminal DATA to the node G. The second transistor T2 is turned on under control of a second gate signal $G2_1$ provided at the second gate signal terminal G2, so as to transmit a signal of the node S to the sensing signal line Sense through the second transistor T2. When the detection data signal $Data_1$ and the power supply voltage signal ELVDD make the node G control the third transistor T3 to be turned off, a magnitude of the sensing signal Sense on the sensing signal line Sense is measured, so that the threshold voltage Vth of the third transistor T3 may be calculated according to a difference between the detection data signal $Data_1$ and the sensing signal Sense.

In the above process, the sensing signal Sense is measured by controlling the sensing transistor (i.e., the second transistor T2). In this way, the threshold voltage of the driving transistor (the third transistor T3) is calculated. After being calculated, the threshold voltage of the driving transistor is compensated into the display data signal $Data_2$, thereby completing an external compensation of the pixel driving circuit 12. Referring to FIG. 2, when the external compensation is performed, the pixel driving circuit 12 needs to receive the first gate signal $G1_1$ and the second gate signal $G2_1$ to turn on the second transistor T2 and the first transistor T1. In this case, the sensing signal terminal Sense is in a floating state, which is equivalent to a capacitor. After the third transistor T3 is turned on under control of the detection data signal $Data_1$, the power supply voltage signal ELVDD will be transmitted to the node S to charge the node S until a potential of the node S no longer changes. In this case, a difference between a potential of the node G and the potential of the node S is equal to the threshold voltage of the third transistor T3. The second transistor T2 is also in an on state, and the signal of the node S transmitted to the sensing signal terminal Sense through the second transistor T2 is the sensing signal Sense. In this case, the magnitude of the sensing signal Sense is equal to the potential of the node S. Therefore, the threshold voltage Vth of the third transistor T3 may be calculated by calculating the difference between the detection data signal $Data_1$ and the sensing signal Sense.

When the pixel driving circuit 12 works in a display period of a frame, a working process of the pixel driving circuit 12 includes, for example, a reset period, a data writing period, and a light-emitting period.

During the reset period, the second transistor T2 is turned on under control of a second gate signal $G2_2$ provided at the second gate signal terminal G2, so as to transmit the reset signal provided at the sensing signal terminal Sense to the node S to reset the anode of the driven device 2.

During the data writing period, the first transistor T1 is turned on under control of a first gate signal $G1_2$ provided at the first gate signal terminal G1, so as to transmit the display data signal $Data_2$ provided at the data signal terminal DATA to the node G to charge the storage capacitor Cst.

During the light-emitting period, the third transistor T3 is turned on under control of the node G, and the storage capacitor Cst starts to discharge to the node G, so that the potential of the node G is maintained for a period of time, thereby ensuring a turned-on duration of the third transistor T3. After being turned on, the third transistor T3 outputs a driving signal to the driven device 2 under control of the power supply voltage signal ELVDD provided by the power line ELVDD and a gate voltage of the third transistor T3. The driving signal is, for example, a driving current. The driven device 2 starts to emit light under control of the driving signal.

During a working process of the pixel driving circuit 12 in a frame, gate signals received by the first gate signal terminal G1 and the second gate signal terminal G2 are both provided by the gate driver circuit.

Figure 3:
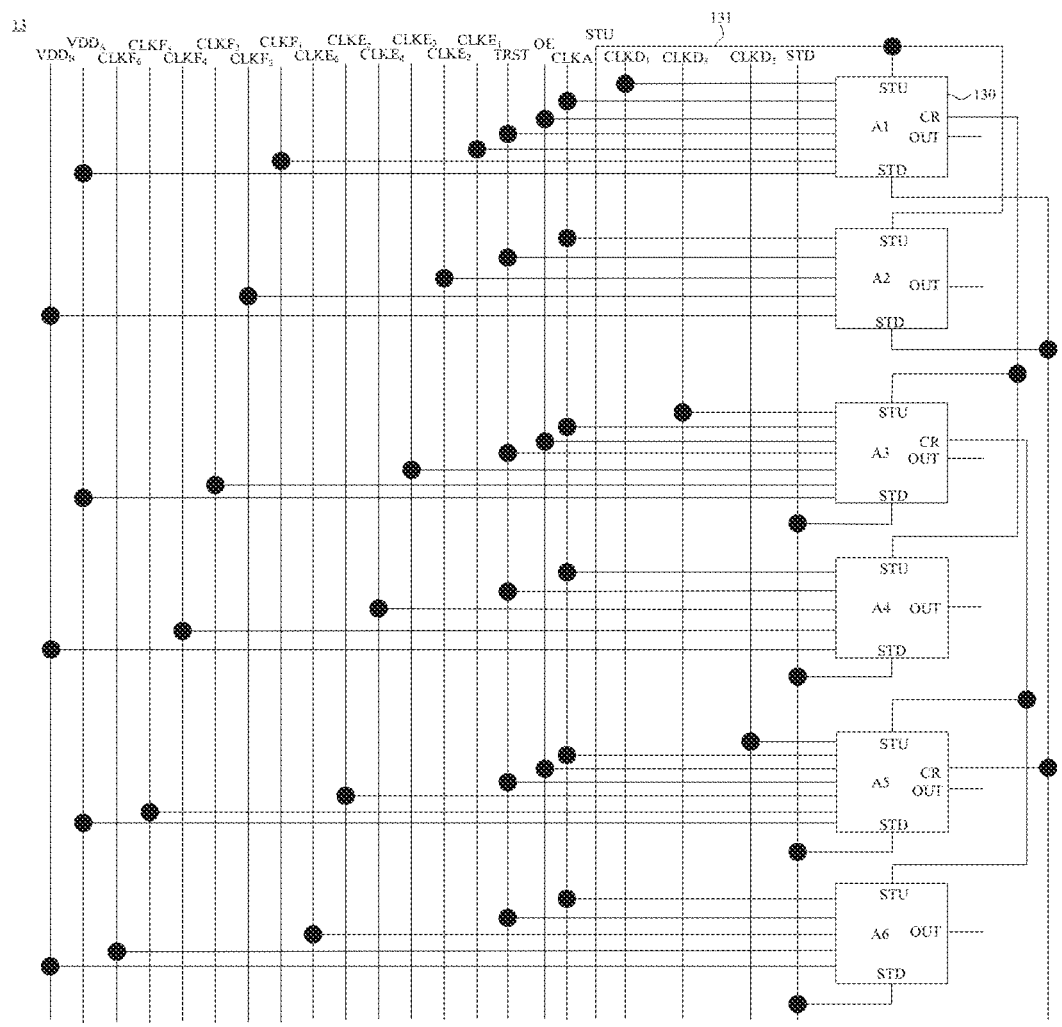
FIG. 3 is a diagram showing a cascade structure of a plurality of shift registers, in accordance with some embodiments.

In some embodiments, as shown in FIG. 1, the driving backplane 1 further includes a plurality of rows of sub-pixels P. Each pixel driving circuit 12 belongs to a respective sub-pixel P. As shown in FIG. 3, the gate driver circuit 13 may include a plurality of shift registers 130 that are cascaded and a plurality of control signal lines 131. At least part of the plurality of control signal lines 131 are coupled to a shift register 130 and are configured to provide control signals to the shift register 130, so as to make the shift register 130 provide gate signals to multiple pixel driving circuits.

Herein, as shown in FIG. 3, in an example where the gate driver circuit 13 includes six shift registers 130 that are cascaded, i.e., a first-stage shift register A1, a second-stage shift register A2, a third-stage shift register A3, a fourth-stage shift register A4, a fifth-stage shift register A5, and a sixth-stage shift register A6. In this case, there are twenty-two control signal lines 131.

Each stage of shift register 130 includes an input signal terminal STU, an output signal terminal OUT, and a reset signal terminal STD. Each of odd-numbered stages of shift registers 130 (i.e., the first-stage shift register A1, the third-stage shift register A3, and the fifth-stage shift register A5) further includes a cascade output signal terminal CR. The input signal terminal STU is configured to receive an input signal STU. The output signal terminal OUT is configured to output the first gate signals $G1_1$ and $G1_2$ and the second gate signals $G2_1$ and $G2_2$ to a gate line connected to the pixel driving circuits 12.

The reset signal terminal STD is configured to receive a reset signal STD. Except that reset signal terminals STD of last four stages of shift registers 130 are provided with reset signals STD by a reset signal line STD, a reset signal STD of another shift register 130 is provided by a cascade output signal terminal CR of an (N+4)-th-stage shift register 130 or an (N+3)-th-stage shift register 130. For example, reset signal terminals STD of the first-stage shift register A1 and the second-stage shift register A2 are coupled to a cascade output signal terminal CR of the fifth-stage shift register A5.

The cascade output signal terminal CR of the shift register 130 is further configured to provide input signals STU to input signal terminals STU of part of the shift registers 130. For example, input signal terminals STU of the third-stage shift register A3 and the fourth-stage shift register A4 are coupled to a cascade output signal terminal CR of the first-stage shift register A1.

The twenty-two control signal lines 131 are an input signal line STU, a global reset signal line TRST, the reset signal line STD, a random signal line OE, a power supply voltage signal line $VDD_A$, a power supply voltage signal line $VDD_B$, a clock signal line CLKA, clock signal lines CLKD (including a clock signal line $CLKD_1$, a clock signal line $CLKD_3$, and a clock signal line $CLKD_5$), clock signal lines CLKE (including a clock signal line $CLKE_1$, a clock signal line $CLKE_2$, a clock signal line $CLKE_3$, a clock signal line $CLKE_4$, a clock signal line $CLKE_5$, and a clock signal line $CLKE_6$), and clock signal lines CLKF, (including a clock signal line $CLKF_1$, a clock signal line $CLKF_2$, a clock signal line $CLKF_3$, a clock signal line $CLKF_4$, a clock signal line $CLKF_5$, and a clock signal line $CLKF_6$).

The input signal line STU is configured to provide input signals STU to input signal terminals STU of multiple shift registers 130. For example, the input signal line STU provides input signals to input signal terminals STU of the first-stage shift register A1 and the second-stage shift register A2. The input signal terminals STU of the third-stage shift register A3 and the fourth-stage shift register A4 are coupled to the cascade output signal terminal CR of the first-stage shift register A1, so that an output signal from the cascade output signal terminal CR of the first-stage shift register A1 is served as an input signal STU. Input signal terminals STU of the fifth-stage shift register A5 and the sixth-stage shift register A6 are coupled to a cascade output signal terminal CR of the third-stage shift register A3, so that an output signal from the cascade output signal terminal CR of the third-stage shift register A3 is served as an input signal STU.

The global reset signal line TRST is configured to provide global reset signals TRST to global reset signal terminals TRST of all the shift registers 130. Therefore, each stage of shift register 130 is coupled to the global reset signal line TRST.

The reset signal line STD is configured to provide reset signals STD to reset signal terminals STD of shift registers 130. The last four stages of the shift registers 130 in the gate driver circuit 13 are coupled to the reset signal line STD.

The random signal line OE is configured to provide random signals OE to random signal terminals OE of shift registers 130. For example, the random signal line OE provides random signals OE to the odd-numbered stages of shift registers 130 (i.e., the first-stage shift register A1, the third-stage shift register A3, and the fifth-stage shift register A5).

The power supply voltage signal line $VDD_A$ and the power supply voltage signal line $VDD_B$ are configured to respectively provide power supply voltage signals $VDD_A$ to power supply voltage signal terminals $VDD_A$ of shift registers 130 and power supply voltage signals $VDD_B$ to power supply voltage signal terminals $VDD_B$ of other shift registers 130. The power supply voltage signal line $VDD_A$ is configured to provide the power supply voltage signals $VDD_A$ to the odd-numbered stages of shift registers 130 (i.e., the first-stage shift register A1, the third-stage shift register A3 and the fifth-stage shift register A5). The power supply voltage signal line $VDD_B$ is configured to provide the power supply voltage signals $VDD_B$ to the even-numbered stages of shift registers 130 (i.e., the second-stage shift register A2, the fourth-stage shift register A4, and the sixth-stage shift register A6).

The clock signal line CLKA is configured to provide clock signals CLKA to clock signal terminals CLKA of shift registers 130. For example, the clock signal line CLKA provides a clock signal CLKA to each stage of shift register 130. Therefore, each stage of shift register 130 needs to be coupled to the clock signal line CLKA.

The clock signal lines CLKD are configured to provide clock signals CLKD to clock signal terminals CLKD of shift registers 130. For example, the clock signal lines CLKD provide the clock signals CLKD to the odd-numbered stages of shift registers 130 (i.e., the first-stage shift register A1, the third-stage shift register A3, and the fifth-stage shift register A5). For example, the clock signal lines CLKD provide a clock signal $CLKD_1$ to the first-stage shift register A1, a clock signal $CLKD_3$ to the third-stage shift register A3, and a clock signal $CLKD_5$ to the fifth-stage shift register A5. The clock signals $CLKD_1$, $CLKD_3$, and $CLKD_5$ may be the same or different, which will not be limited in the embodiments of the present disclosure.

The clock signal lines CLKE are configured to provide clock signals CLKE to clock signal terminals CLKE of shift registers 130. For example, the clock signal lines CLKE provide a clock signal CLKE to each stage of shift register 130. Therefore, each stage of shift register 130 needs to be coupled to a clock signal line CLKE. The first-stage shift register A1 is coupled to the clock signal line $CLKE_1$, the second-stage shift register A2 is coupled to the clock signal line $CLKE_2$, the third-stage shift register A3 is coupled to the clock signal line $CLKE_3$, the fourth-stage shift register A4 is coupled to the clock signal line $CLKE_4$, the fifth-stage shift register A5 is coupled to the clock signal line $CLKE_5$, and the sixth-stage shift register A6 is coupled to the clock signal line $CLKE_6$. Clock signals $CLKE_1$, $CLKE_2$, $CLKE_3$, $CLKE_4$, $CLKE_5$, and $CLKE_6$ may be the same or different, which are not limited in the embodiments of the present disclosure.

The clock signal lines CLKF are configured to provide clock signals CLKF to clock signal terminals CLKF of shift registers 130. For example, the clock signal lines CLKF provide a clock signal CLKF to each stage of shift register 130. Therefore, each stage of shift register 130 needs to be coupled to a clock signal line CLKF. The first-stage shift register A1 is coupled to the clock signal line $CLKF_1$, the second-stage shift register A2 is coupled to the clock signal line $CLKF_2$, the third-stage shift register A3 is coupled to the clock signal line $CLKF_3$, the fourth-stage shift register A4 is coupled to the clock signal line $CLKF_4$, the fifth-stage shift register A5 is coupled to the clock signal line $CLKF_5$, and the sixth-stage shift register A6 is coupled to the clock signal line $CLKF_6$. Clock signals $CLKF_1$, $CLKF_2$, $CLKF_3$, $CLKF_4$, $CLKF_5$, and $CLKF_6$ may be the same or different, which are not limited in the embodiments of the present disclosure.

In some embodiments, the clock signal CLKE and the clock signal CLKF are the same. That is, the clock signal $CLKE_1$ is the same as the clock signal $CLKF_1$, the clock signal $CLKE_2$ is the same as the clock signal $CLKF_2$, the clock signal $CLKE_3$ is the same as the clock signal $CLKF_3$, the clock signal $CLKE_4$ is the same as the clock signal $CLKF_4$, the clock signal $CLKE_5$ is the same as the clock signal $CLKF_5$, and the clock signal $CLKE_6$ is the same as the clock signal $CLKF_6$.

Figure 4:
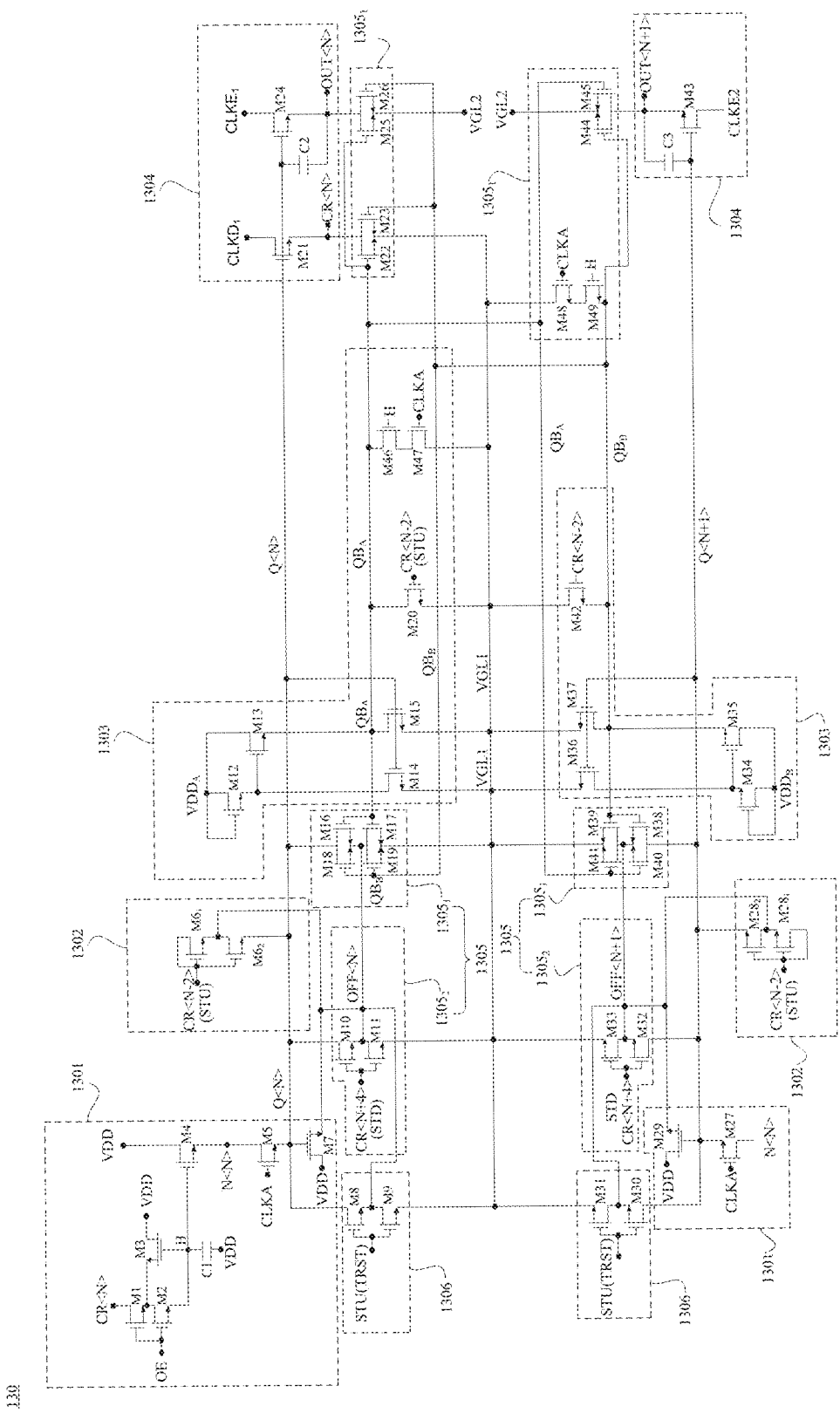
FIG. 4 is a diagram showing an equivalent circuit structure of shift registers, in accordance with some embodiments.

Based on the diagram showing the cascade structure of the plurality of shift registers 130 shown in FIG. 3, referring to FIG. 4, a shift register 130 is provided in some embodiments of the present disclosure. The shift register 130 includes a blanking input sub-circuit 1301, a display input sub-circuit 1302, a control sub-circuit 1303, an output sub-circuit 1304, a reset sub-circuit 1305, and a global reset sub-circuit 1306.

For example, for an N-th-stage shift register 130, the blanking input sub-circuit 1301 is configured to control the gate driver circuit 13 to output a blanking control signal to the pixel driving circuit 12 during the blanking period of a frame, e.g., output a first gate signal $G1_1$ to a gate line Gate. Both the first transistor T1 and the second transistor T2 are turned on under control of the first gate signal $G1_1$, so that the signal of the node S may be transmitted to the sensing signal terminal Sense, and a magnitude of the signal at the sensing signal terminal Sense is measured to obtain the sensing signal Sense. During the blanking period, the pixel driving circuit 12 does not drive the driven device 2 to emit light, but the threshold voltage of the third transistor T3 is obtained. The process of obtaining the threshold voltage of the third transistor T3 has been described above, so it will not be repeated.

The blanking input sub-circuit 1301 includes, for example, a first transistor M1, a second transistor M2, a third transistor M3, a fourth transistor M4, a fifth transistor M5, a seventh transistor M7, and a first capacitor C1.

A gate electrode of the first transistor M1 is coupled to the random signal terminal OE, a first electrode of the first transistor M1 is coupled to the cascade output signal terminal CR<N>, and a second electrode of the first transistor M1 is coupled to a first electrode of the second transistor M2. A gate electrode of the second transistor M2 is coupled to the random signal terminal OE, and a second electrode of the second transistor M2 is coupled to a node H. A gate electrode of the third transistor M3 is coupled to the node H, a first electrode of the third transistor M3 is coupled to the power supply voltage signal terminal VDD, and a second electrode of the third transistor M3 is coupled to the second electrode of the first transistor M1. A gate electrode of the fourth transistor M4 is coupled to the node H, a first electrode of the fourth transistor M4 is coupled to the power supply voltage signal terminal VDD, and a second electrode of the fourth transistor M4 is coupled to a node N<N>. A gate electrode of the fifth transistor M5 is coupled to the clock signal terminal CLKA, a first electrode of the fifth transistor M5 is coupled to the node N<N>, and a second electrode of the fifth transistor M5 is coupled to a pull-up node Q<N>. A gate electrode of the seventh transistor M7 is coupled to the pull-up node Q<N>, a first electrode of the seventh transistor M7 is coupled to the power supply voltage signal terminal VDD, and a second electrode of the seventh transistor M7 is coupled to a leakage prevention node OFF<N>. A terminal of the first capacitor C1 is coupled to the node H, and another terminal of the first capacitor C1 is coupled to the power supply voltage signal terminal VDD.

The display input sub-circuit 1302 is configured to control the gate driver circuit 13 to output a display control signal to the pixel driving circuit 12 during the display period of a frame, e.g., output a second gate signal $G2_2$ to a gate line Gate. Both the first transistor T1 and the second transistor T2 are turned on under control of the second gate signal $G2_2$, so that the reset signal provided by the sensing signal terminal Sense is transmitted to the node S through the second transistor T2. During the display period, the pixel driving circuit 12 drives the light-emitting device D to emit light. The process of driving the light-emitting device D to emit light by the pixel driving circuit 12 has been described above, so it will not be repeated.

The display input sub-circuit 1302 includes, for example, two sixth transistors M6. The two sixth transistors are, for example, a sixth transistor $M6_1$ and a sixth transistor $M6_2$. A gate electrode and a first electrode of the sixth transistor $M6_1$ are coupled to a cascade output signal terminal CR<N−2>, and a second electrode of the sixth transistor $M6_1$ is coupled to a first electrode of the sixth transistor $M6_2$. A gate electrode of the sixth transistor $M6_2$ is coupled to the cascade output signal terminal CR<N−2>, the first electrode of the sixth transistor $M6_2$ is coupled to the leakage prevention node OFF<N>, and a second electrode of the sixth transistor $M6_2$ is coupled to the pull-up node Q<N>.

The control sub-circuit 1303 is configured to control a potential of the pull-up node Q<N> and a potential of a first pull-down node $QB_A$ to be balanced. For example, when the pull-up node Q<N> is at a high level, the control sub-circuit 1303 controls the potential of the first pull-down node $QB_A$ to be a low level. When the potential of the first pull-down node $QB_A$ is a high level, the control sub-circuit 1303 controls the potential of the pull-up node Q<N> to be a high level.

The control sub-circuit 1303 includes, for example, a twelfth transistor M12, a thirteenth transistor M13, a fourteenth transistor M14, a fifteenth transistor M15, a twentieth transistor M20, a forty-sixth transistor M46, and a forty-seventh transistor M47.

A gate electrode and a first electrode of the twelfth transistor M12 are coupled to the power supply voltage signal terminal $VDD_A$, and a second electrode of the twelfth transistor M12 is coupled to a gate electrode of the thirteenth transistor M13. A first electrode of the thirteenth transistor M13 is coupled to the power supply voltage signal terminal $VDD_A$, and a second electrode of the thirteenth transistor M13 is coupled to the first pull-down node $QB_A$. A gate electrode of the fourteenth transistor M14 is coupled to the pull-up node Q<N>, a first electrode of the fourteenth transistor M14 is coupled to the gate electrode of the thirteenth transistor M13, and a second electrode of the fourteenth transistor M14 is coupled to a first voltage signal terminal VGL1. A gate electrode of the fifteenth transistor M15 is coupled to the pull-up node Q<N>, a first electrode of the fifteenth transistor M15 is coupled to the first pull-down node $QB_A$, and a second electrode of the fifteenth transistor M15 is coupled to the first voltage signal terminal VGL1. A gate electrode of the twentieth transistor M20 is coupled to the cascade output signal terminal CR<N−2>, a first electrode of the twentieth transistor M20 is coupled to the first pull-down node $QB_A$, and a second electrode of the twentieth transistor M20 is coupled to the first voltage signal terminal VGL1. A gate electrode of the forty-sixth transistor M46 is coupled to the node H, a first electrode of the forty-sixth transistor M46 is coupled to the first pull-down node $QB_A$, and a second electrode of the forty-sixth transistor M46 is coupled to a second electrode of the forty-seventh transistor M47. A gate electrode of the forty-seventh transistor M47 is coupled to the clock signal terminal CLKA, and a first electrode of the forty-seventh transistor M47 is coupled to the first voltage signal terminal VGL1.

The output sub-circuit 1304 is configured to output the first gate signal $G1_1$ during the blanking period of the frame, and output the second gate signal $G2_2$ during the display period of the frame.

The output sub-circuit 1304 includes, for example, a twenty-first transistor M21, a twenty-fourth transistor M24, and a second capacitor C2.

A gate electrode of the twenty-first transistor M21 is coupled to the pull-up node Q<N>, a first electrode of the twenty-first transistor M21 is coupled to the clock signal terminal $CLKD_1$, and a second electrode of the twenty-first transistor M21 is coupled to the cascade output signal terminal CR<N>. A gate electrode of the twenty-fourth transistor M24 is coupled to the pull-up node Q<N>, a first electrode of the twenty-fourth transistor M24 is coupled to the clock signal terminal $CLKE_1$, and a second electrode of the twenty-fourth transistor M24 is coupled to an output signal terminal OUT<N>. A terminal of the second capacitor C2 is coupled to the gate electrode of the twenty-fourth transistor M24, and another terminal of the second capacitor C2 is coupled to the output signal terminal OUT<N>.

The reset sub-circuit 1305 is configured to reset the pull-up node Q<N>, the first pull-down node $QB_A$, the leakage prevention node OFF<N>, and the output sub-circuit 1304. The reset sub-circuit 1305 includes, for example, a first reset sub-circuit $1305_1$ and a second reset sub-circuit $1305_2$. The first reset sub-circuit $1305_1$ is configured to reset the pull-up node Q<N>, the first pull-down node $QB_A$ and the output sub-circuit 1304. The second reset sub-circuit $1305_2$ is configured to reset the pull-up node Q<N> and the leakage prevention node OFF<N>.

The first reset sub-circuit $1305_1$ includes, for example, a sixteenth transistor M16, a seventeenth transistor M17, an eighteenth transistor M18, a nineteenth transistor M19, a twenty-second transistor M22, a twenty-third transistor M23, a twenty-fifth transistor M25 and a twenty-sixth transistor M26.

A gate electrode of the sixteenth transistor M16 is coupled to the first pull-down node $QB_A$, a first electrode of the sixteenth transistor M16 is coupled to a second electrode of the seventeenth transistor M17, and a second electrode of the sixteenth transistor M16 is coupled to the pull-up node Q<N>. A gate electrode of the seventeenth transistor M17 is coupled to the first pull-down node $QB_A$, and a first electrode of the seventeenth transistor M17 is coupled to the first voltage signal terminal VGL1. A gate electrode of the eighteenth transistor M18 is coupled to a second pull-down node $QB_B$, a first electrode of the eighteenth transistor M18 is coupled to a second electrode of the nineteenth transistor M19, and a second electrode of the eighteenth transistor M18 is coupled to the pull-up node Q<N>. A gate electrode of the nineteenth transistor M19 is coupled to the second pull-down node $QB_B$, and a first electrode of the nineteenth transistor M19 is coupled to the first voltage signal terminal VGL1. A gate electrode of the twenty-second transistor M22 is coupled to the first pull-down node $QB_A$, a first electrode of the twenty-second transistor M22 is coupled to the first voltage signal terminal VGL1, and a second electrode of the twenty-second transistor M22 is coupled to the cascade output signal terminal CR<N>. A gate electrode of the twenty-third transistor M23 is coupled to the second pull-down node $QB_B$, a first electrode of the twenty-third transistor M23 is coupled to the first voltage signal terminal VGL1, and a second electrode of the twenty-third transistor M23 is coupled to the cascade output signal terminal CR<N>. A gate electrode of the twenty-fifth transistor M25 is coupled to the first pull-down node $QB_A$, a first electrode of the twenty-fifth transistor M25 is coupled to a second voltage signal terminal VGL2, and a second electrode of the twenty-fifth transistor M25 is coupled to the output signal terminal OUT<N>. A gate electrode of the twenty-sixth transistor M26 is coupled to the second pull-down node $QB_B$, a first electrode of the twenty-sixth transistor M26 is coupled to the second voltage signal terminal VGL2, and a second electrode of the twenty-sixth transistor M26 is coupled to the output signal terminal OUT<N>.

The second reset sub-circuit $1305_2$ includes, for example, a tenth transistor M10 and an eleventh transistor M11.

A gate electrode of the tenth transistor M10 is coupled to a cascade output signal terminal CR<N+4>, a first electrode of the tenth transistor M10 is coupled to a second electrode of the eleventh transistor M11, and a second electrode of the tenth transistor M10 is coupled to the pull-up node Q<N>. A gate electrode of the eleventh transistor M11 is coupled to the cascade output signal terminal CR<N+4>, a first electrode of the eleventh transistor M11 is coupled to the first voltage signal terminal VGL1, and the second electrode of the eleventh transistor M11 is coupled to the leakage prevention node OFF<N>.

The global reset sub-circuit 1306 is configured to reset the pull-up node Q<N> and the leakage prevention node OFF<N> for a second time.

The global reset sub-circuit 1306 includes, for example, an eighth transistor M8 and a ninth transistor M9.

A gate electrode of the eighth transistor M8 is coupled to the input signal terminal STU, a first electrode of the eighth transistor M8 is coupled to a second electrode of the ninth transistor M9, and a second electrode of the eighth transistor M8 is coupled to the pull-up node Q<N>. A gate electrode of the ninth transistor M9 is coupled to the input signal terminal STU, a first electrode of the ninth transistor M9 is coupled to the first voltage signal terminal VGL1, and the second electrode of the ninth transistor M9 is coupled to the leakage prevention node OFF<N>.

The above is a description of a structure of the N-th-stage shift register in FIG. 4. Referring to FIG. 4, a structure of the (N+1)-th-stage shift register is similar to the structure of the N-th-stage shift register. The N-th-stage shift register and the (N+1)-th-stage shift register share part of the thin film transistors. In some other aspects, for example, referring to FIG. 4, the (N+1)-th-stage shift register includes, for example, a twenty-seventh transistor M27 and a twenty-ninth transistor M29 that are used to constitute a blanking input sub-circuit 1301, two twenty-eighth transistors $M28_1$ and $M28_2$ that are used to constitute a display input sub-circuit 1302, a thirty-fourth transistor M34, a thirty-fifth transistor M35, a thirty-sixth transistor M36, a thirty-seventh transistor M37, and a forty-second transistor M42 that are used to constitute a control sub-circuit 1303, a forty-third transistor M43 and a third capacitor C3 that are used to constitute an output sub-circuit 1304, a thirty-eighth transistor M38, a thirty-ninth transistor M39, a fortieth transistor M40, a forty-first transistor M41, a forty-fourth transistor M44, a forty-fifth transistor M45, a forty-eighth transistor M48, and a forty-ninth transistor M49 that are used to constitute a first reset sub-circuit $1305_1$ in a reset sub-circuit 1305, a thirty-second transistor M32 and a thirty-third transistor M33 that are used to constitute a second reset sub-circuit $1305_2$, and a thirtieth transistor M30 and a thirty-first transistor M31 that are used to constitute a global reset sub-circuit 1306.

The blanking input sub-circuit 1301 in the (N+1)-th row and the blanking input sub-circuit 1301 in the N-th row share the first transistor M1, the second transistor M2, the third transistor M3, the fourth transistor M4, and the first capacitor C1.

The twelfth transistor M12, the thirteenth transistor M13, the fourteenth transistor M14, and the fifteenth transistor M15 in the N-th-stage shift register and the thirty-fourth transistor M34, the thirty-fifth transistor M35, the thirty-sixth transistor M36, and the thirty-seventh transistor M37 in the (N+1)-th-stage shift register are used for power supply control. Therefore, these transistors may be referred to as power supply control transistors.

The twenty-fourth transistor M24 in the N-th-stage shift register and the forty-third transistor M43 in the (N+1)-th-stage shift register are each used to output gate signals (the first gate signal $G1_2$ and the second gate signal $G2_1$) to the pixel driving circuit 12. Therefore, these transistors may be referred to as output transistors.

It will be noted that, referring to FIG. 4, since the global reset sub-circuit 1306 is controlled through the input signal terminal STU, an input signal STU provided from the input signal terminal STU may be understood as a global reset signal TRST. The global reset signal TRST may be understood as a general term for this type of signals that may control the global reset sub-circuit 1306. Of course, not only the input signal STU but also other gate driving signals may be served as the global reset signal TRST, as long as the gate driving signals are capable of controlling the global reset sub-circuit 1306 to normally work.

It will be further noted that, the cascade output signal terminal CR<N> is a cascade output signal terminal of the N-th-stage shift register, the cascade output signal terminal CR<N+4> is a cascade output signal terminal of the (N+4)-th-stage shift register, and the cascade output signal terminal CR<N−2> is a cascade output signal terminal of the (N−2)-th-stage shift register. Each stage of shift register 130 includes at least a cascade output signal terminal CR and an output signal terminal OUT<N>. The cascade output signal terminal CR is configured to be coupled to other stages of shift registers 130. For example, referring to FIG. 4, the N-th-stage shift register is coupled to the (N−2)-th and the (N+4)-th stages of shift registers. A cascade output signal CR<N−2> provided by the (N−2)-th-stage shift register may be served as the input signal STU of the display input sub-circuit 1302 (e.g., a CR<N−2> signal received by the gate electrodes of the sixth transistors M6), and a control signal of the control sub-circuit 1303 (e.g., a CR<N−2> signal received by the gate electrode of the twentieth transistor M20). A cascade output signal CR<N+4> of the (N+4)-th-stage shift register 130 may be served as a row reset signal, and this row reset signal is used to control the second reset sub-circuit $1305_2$ of the N-th-stage shift register to work. Those skilled in the art may understand that the reset signal STD provided by the reset signal terminal STD is also a row reset signal. For example, in the gate driver circuit 13, the second reset sub-circuits $1305_2$ of the last four stages of shift registers 130 are coupled to the reset signal line STD, and the second reset sub-circuits $1305_2$ of the other shift registers 130 are, for example, coupled to the cascade output signal terminal CR<N+4>.

In a frame, the display period precedes the blanking period. That is, the shift register 130 first outputs the second gate signal $G2_2$ to the pixel driving circuit 12 and then outputs the first gate signal $G1_1$ to the pixel driving circuit 12.

Figure 5:
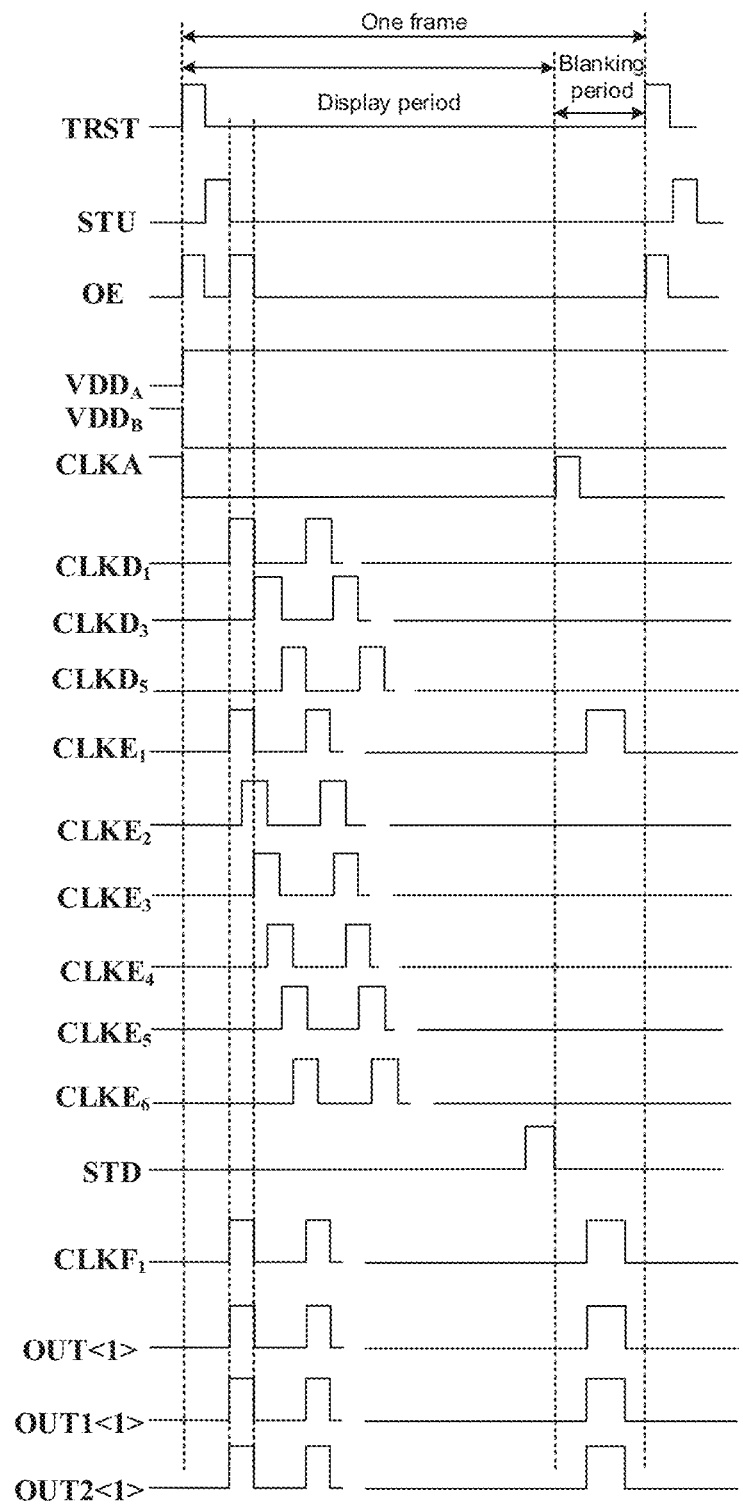
FIG. 5 is a timing diagram corresponding to the shift registers shown in FIG. 4 and FIG. 6.

Referring to FIG. 5, for the N-th-stage shift register 130, during the display period, firstly, the global reset signal provided by the global reset signal terminal TRST is at a high level, so that the global reset sub-circuit 1306 starts to work. The eighth transistor M8 and the ninth transistor M9 are turned on to reset the pull-up node Q<N> and the leakage prevention node OFF<N>, respectively. The random signal OE provided by the random signal terminal OE is at a high level, and the first transistor M1 and the second transistor M2 are turned on. In this case, since there is no signal output from the cascade output signal terminal CR<N>, a potential of the node H is at a low level. The power supply voltage signal $VDD_A$ provided by the power supply voltage signal terminal $VDD_A$ is at a high level, and the twelfth transistor M12 and the thirteenth transistor M13 in the control sub-circuit 1303 are turned on to charge the first pull-down node $QB_A$, so as to make the potential of the first pull-down node $QB_A$ be at a high level. Secondly, the input signal STU provided by the input signal terminal STU is at a high level, and the twentieth transistor M20 is turned on to transmit the first voltage signal VGL1 to the first pull-down node $QB_A$, so that the potential of the first pull-down node $QB_A$ becomes low. When the input signal STU is at the high level, the display input sub-circuit 1302 starts to work. The two sixth transistors $M6_1$ and $M6_2$ are turned on to charge the pull-up node Q<N> and the leakage prevention node OFF<N>, so as to make potentials of the pull-up node Q<N> and the leakage prevention node OFF<N> be at a high level. When the potential of the pull-up node Q<N> is at a high level, the fourteenth transistor M14 and the fifteenth transistor M15 are turned on, so as to make the thirteenth transistor M13 be turned off and make the potential of the first pull-down node $QB_A$ continue to maintain low. In addition, when the potential of the pull-up node Q<N> is at the high level, the twenty-first transistor M21 and the twenty-fourth transistor M24 are turned on, so that the cascade output signal terminal CR<N> and the output signal terminal OUT<N> start to output signals. The signal output by the cascade output signal terminal CR<N> is, for example, an input signal STU of the (N+2)-th-stage shift register 130 or the (N+3)-th-stage shift register 130, and the output signal output by the output signal terminal OUT<N> is, for example, the second gate signal $G2_2$. In addition, when the potential of the pull-up node Q<N> is at the high level, the seventh transistor M7 is turned on to transmit the power supply voltage signal VDD provided by the power supply voltage signal terminal VDD to the leakage prevention node OFF<N>, so the potential of the leakage prevention node OFF<N> is at a high level. In this case, for the tenth transistor M10, the first electrode thereof is coupled to the leakage prevention node OFF<N>, so the first electrode is at a high level; and the second electrode thereof is coupled to the pull-up node Q<N>, so the second electrode is also at a high level. As a result, it is possible to prevent charges at the pull-up node Q<N> from leaking through the tenth transistor M10, and achieve a function of leakage prevention. In a case where the clock signal $CLKD_1$ provided by the clock signal terminal $CLKD_1$ is at a high level, and the random signal OE is also at a high level, the blanking input sub-circuit 1301 charges the node H through the first transistor M1 and the second transistor M2. Due to the existence of the first capacitor C1, the high level of the node H may be maintained for a period of time. When the potential of the node H is at a high level, the fourth transistor M4 and the forty-sixth transistor M46 transistor M46 are turned on, and since the clock signal CLKA provided by the clock signal terminal CLKA is at a low level during an entire display period, the fifth transistor M5 is maintained in an off state during the display period, and a potential of the node N<N> coupled to the second electrode of the fourth transistor M4 is always at a low level during the display period. In a case where there is no signal output from the fifth transistor M5, the seventh transistor M7 is in an off state. Finally, when the reset signal STD provided by the reset signal terminal STD is at a high level, the tenth transistor M10 and the eleventh transistor M11 are turned on to reset the pull-up node Q<N> and the leakage prevention node OFF<N>, so that potentials of the pull-up node Q<N> and the leakage prevention node OFF<N> become low. When the potential of the pull-up node Q<N> becomes low, the cascade output signal terminal CR<N> and the output signal terminal OUT<N> stop outputting signals. Moreover, since the power supply voltage signal $VDD_A$ is at the high level, the potential of the first pull-down node $QB_A$ returns to be at a high level. When the potential of the first pull-down node $QB_A$ is at the high level, the sixteenth transistor M16, the seventeenth transistor M17, the twenty-second transistor M22, and the twenty-fifth transistor M25 are turned on. The sixteenth transistor M16 and the seventeenth transistor M17 may transmit the first voltage signals VGL1 to the pull-up node Q<N> and the leakage prevention node OFF<N>, respectively, so as to reset the pull-up node Q<N> and the leakage prevention node OFF<N>. The twenty-second transistor M22 may transmit the first voltage signal VGL1 to the cascade output signal terminal CR<N> to reset the cascade output signal terminal CR<N>. The twenty-fifth transistor M25 may transmit a low-level second voltage signal VGL2 provided by the second voltage signal terminal VGL2 to the output signal terminal OUT<N>, so as to reset the output signal terminal OUT<N>. The display period ends.

During the blanking period, since the clock signal CLKA is at a high level, and the potential of the node H may be maintained until the blanking period, the fourth transistor M4 may output a high-level signal to the node N<N>, and the potential of the node N becomes at a high level. Since potentials of the clock signal CLKA and the node H are at a high level, the forty-sixth transistor M46 and the forty-seventh transistor M47 are both turned on to transmit the low-level first voltage signal VGL1 provided by the first voltage signal terminal VGL1 to the first pull-down node $QB_A$, so that the potential of the first pull-down node $QB_A$ become low. Since the clock signal CLKA is at the high level, the fifth transistor M5 is turned on to transmit the signal of the node N<N> to the pull-up node Q<N>, so that the potential of the pull-up node Q<N> become at a high level. After the potential of the pull-up node Q<N> becomes at the high level, the output signal terminal OUT<N> starts to output the first gate signal $G1_1$, the clock signal $CLKD_1$ is at a low level and the clock signal $CLKE_1$ is at the high level.

In a case where an external voltage signal terminal makes the second pull-down node $QB_B$ be at a high level, the eighteenth transistor M18, the nineteenth transistor M19, the twenty-third transistor M23, the twenty-sixth transistor M26 are turned on. The eighteenth transistor M18 and the nineteenth transistor M19 may transmit the first voltage signals VGL1 to the pull-up node Q<N> and the leakage prevention node OFF<N>, respectively, so as to reset the pull-up node Q<N> and the leakage prevention node OFF<N>. The twenty-third transistor M23 may transmit the first voltage signal VGL1 to the cascade output signal terminal CR<N> to reset the cascade output signal terminal CR<N>. The twenty-sixth transistor M26 may transmit the second voltage signal VGL2 to the output signal terminal OUT<N> to reset the output signal terminal OUT<N>.

Those skilled in the art may understand that, the foregoing description of the structures and the number of the shift registers 130 and the number and types of the control signal lines 131 included in the gate driver circuit 13 is exemplary, which does not limit the structures and the number of the shift registers 130 and the number and types of the control signal lines 131.

Figure 6:
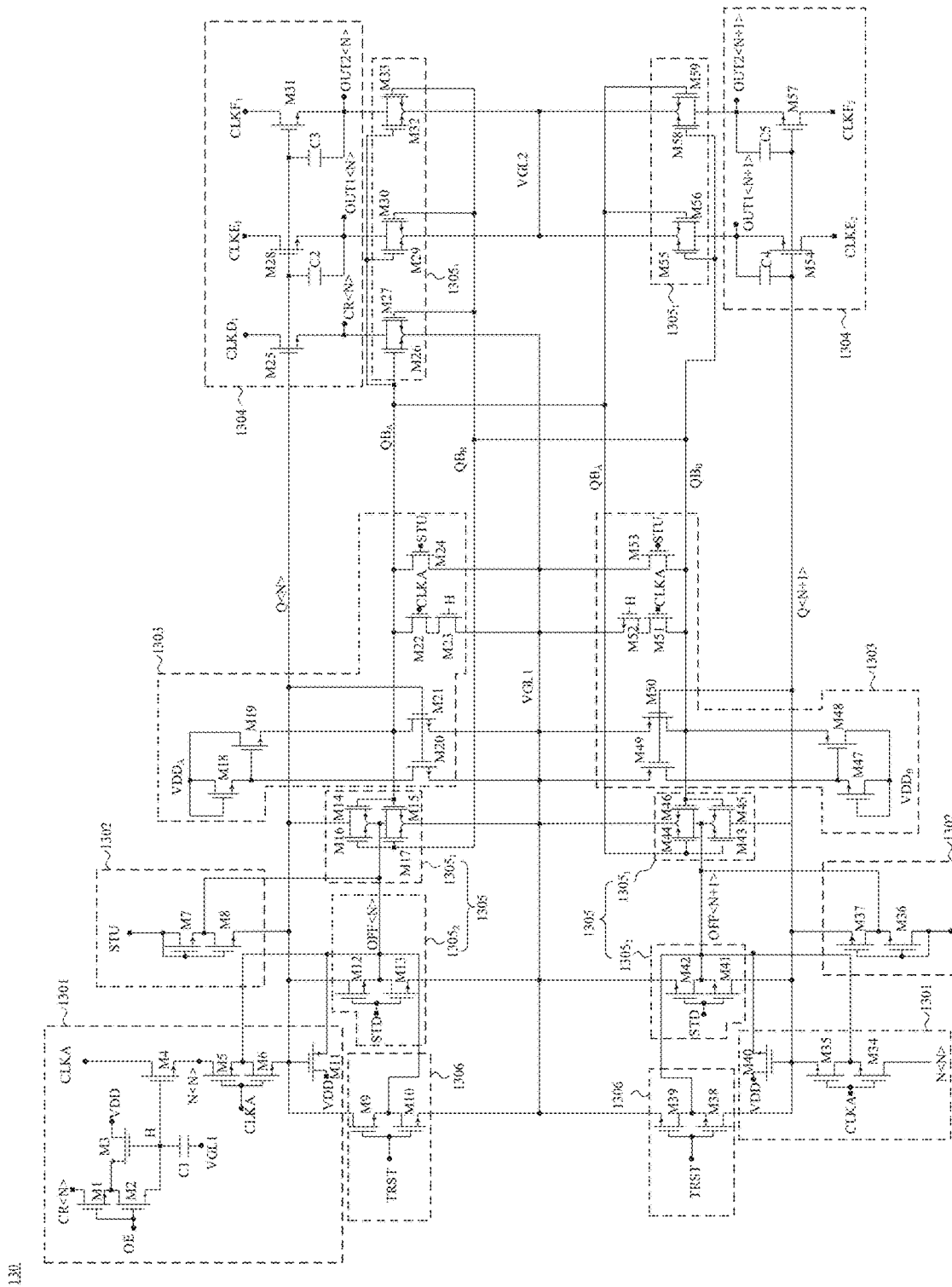
FIG. 6 is a diagram showing an equivalent circuit structure of shift registers, in accordance with some other embodiments.

It will also be noted that, the above is only described by taking an example in which a shift register 130 only includes a single output signal terminal OUT<N>. In this case, the first gate signal terminal G1, the second gate signal terminal G2, and the output signal terminal OUT<N> may all be connected to a gate line Gate, so that the output signal terminal OUT<N> outputs the first gate signal $G1_1$ to the first gate signal terminal G1, and outputs the second gate signal $G2_2$ to the second gate signal terminal G2. Those skilled in the art can understand that, the shift register 130 may also include two output signal terminals, i.e., as shown in FIG. 6, a first output signal terminal (which may be denoted as OUT1<N>) and a second output signal terminal (which may be denoted as OUT2<N>). In this case, the first gate signal terminal G1 and the second gate signal terminal G2, and the first output signal terminal OUT1 and the second output signal terminal OUT2 may all be connected to one gate line Gate, so as to output first gate signals such as $G1_1$ and $G1_2$ to the first gate signal terminal G1, and to output the second gate signals such as $G2_1$ and $G2_2$ to the second gate signal terminal G2.

Hereinafter, a specific structure of a shift register 130 including two output signal terminals will be exemplarily described.

As shown in FIG. 6, the blanking input sub-circuit 1301 includes, for example, a first transistor M1, a second transistor M2, a third transistor M3, a fourth transistor M4, a fifth transistor M5, a sixth transistor M6, an eleventh transistor M11 and a first capacitor C1.

A gate electrode of the first transistor M1 is coupled to the random signal terminal OE, a first electrode of the first transistor M1 is coupled to the cascade output signal terminal CR<N>, and a second electrode of the first transistor M1 is coupled to a first electrode of the second transistor M2. A gate electrode of the second transistor M2 is coupled to the random signal terminal OE, the first electrode of the second transistor M2 is coupled to a second electrode of the third transistor M3, and a second electrode of the second transistor M2 is coupled to a node H. A gate electrode of the third transistor M3 is coupled to the node H, a first electrode of the third transistor M3 is coupled to the power supply voltage signal terminal VDD, and the second electrode of the third transistor M3 is coupled to the second electrode of the first transistor M1. A gate electrode of the fourth transistor M4 is coupled to the node H, a first electrode of the fourth transistor M4 is coupled to the clock signal terminal CLKA, and a second electrode of the fourth transistor M4 is coupled to a node N<N>. A gate electrode of the fifth transistor M5 is coupled to the clock signal terminal CLKA, a first electrode of the fifth transistor M5 is coupled to the node N<N>, and a second electrode of the fifth transistor M5 is coupled to a first electrode of the sixth transistor M6. A gate electrode of the sixth transistor M6 is coupled to the clock signal terminal CLKA, the first electrode of the sixth transistor M6 is further coupled to a leakage prevention node OFF<N>, and a second electrode of the sixth transistor M6 is coupled to a pull-up node Q<N>. A gate electrode of the eleventh transistor M11 is coupled to the pull-up node Q<N>, a first electrode of the eleventh transistor M11 is coupled to the power supply voltage signal terminal VDD, and a second electrode of the eleventh transistor M11 is coupled to the leakage prevention node OFF<N>. A terminal of the first capacitor C1 is coupled to the node H, and another terminal of the first capacitor C1 is coupled to the first voltage signal terminal VGL1.

The display input sub-circuit 1302 is configured to control the gate driver circuit 13 to output a display control signal to the pixel driving circuit 12 during the display period of a frame, for example, output the first gate signal $G1_2$ to the first gate signal terminal G1, and output the second gate signal $G2_2$ to the second gate signal terminal G2. The first transistor T1 is turned on under control of the first gate signal $G1_2$, and the second transistor T2 is turned on under control of the second gate signal $G2_2$, so that the reset signal provided by the sensing signal terminal Sense is transmitted to the node S through the second transistor T2. During the display period, the pixel driving circuit 12 drives the light-emitting device D to emit light, and the process of driving the light-emitting device D to emit light by the pixel driving circuit 12 has been described above, so it will not be repeated.

The display input sub-circuit 1302 includes, for example, a seventh transistor M7 and an eighth transistor M8.

A gate electrode and a first electrode of the seventh transistor M7 are both coupled to the input signal terminal STU, and a second electrode of the seventh transistor M7 is coupled to a first electrode of the eighth transistor M8 and the leakage prevention node OFF<N>. A gate electrode of the eighth transistor M8 is coupled to the input signal terminal STU, and a second electrode of the eighth transistor M8 is coupled to the pull-up node Q<N>. During the display period, the seventh transistor M7 and the eighth transistor M8 are turned on under control of an input signal STU provided by the input signal terminal STU, so as to transmit the high-level input signal STU to the pull-up node Q<N> and the leakage prevention node OFF<N> to pull up potentials of the pull-up node Q<N> and the leakage prevention node OFF<N>.

The control sub-circuit 1303 is configured to control a potential of the pull-up node Q<N> and a potential of the first pull-down node $QB_A$ to be balanced. For example, when the pull-up node Q<N> is at a high level, the control sub-circuit 1303 controls the potential of the first pull-down node $QB_A$ to be at a low level. When the potential of the first pull-down node $QB_A$ is at a high level, the control sub-circuit 1303 controls the potential of the pull-up node Q<N> to be at a high level.

The control sub-circuit 1303 includes, for example, an eighteenth transistor M18, a nineteenth transistor M19, a twentieth transistor M20, a twenty-first transistor M21, a twenty-second transistor M22, a twenty-third transistor M23 and a twenty-fourth transistor M24.

Agate electrode and a first electrode of the eighteenth transistor M18 are coupled to the power supply voltage signal terminal $VDD_A$, and a second electrode of the eighteenth transistor M18 is coupled to a gate electrode of the nineteenth transistor M19. A first electrode of the nineteenth transistor M19 is coupled to the power supply voltage signal terminal $VDD_A$, and a second electrode of the nineteenth transistor M19 is coupled to the first pull-down node $QB_A$. A gate electrode of the twentieth transistor M20 is coupled to the pull-up node Q<N>, a first electrode of the twentieth transistor M20 is coupled to the gate electrode of the nineteenth transistor M19, and a second electrode of the twentieth transistor M20 is coupled to the first voltage signal terminal VGL1. A gate electrode of the twenty-first transistor M21 is coupled to the pull-up node Q<N>, a first electrode of the twenty-first transistor M21 is coupled to the first voltage signal terminal VGL1, and a second electrode of the twenty-first transistor M21 is coupled to the first pull-down node $QB_A$. A gate electrode of the twenty-second transistor M22 is coupled to the clock signal terminal CLKA, a first electrode of the twenty-second transistor M22 is coupled to the first pull-down node $QB_A$, and a second electrode of the twenty-second transistor M22 is coupled to a second electrode of the twenty-third transistor M23. A gate electrode of the twenty-third transistor M23 is coupled to the node H, and a first electrode of the twenty-third transistor M23 is coupled to the first voltage signal terminal VGL1. A gate electrode of the twenty-fourth transistor M24 is coupled to the input signal terminal STU, a first electrode of the twenty-fourth transistor M24 is coupled to the first voltage signal terminal VGL1, and a second electrode of the twenty-fourth transistor M24 is coupled to the first pull-down node $QB_A$. The eighteenth transistor M18 is turned on under control of a power supply voltage signal $VDD_A$ provided by the power supply voltage signal terminal $VDD_A$, so that the eighteenth transistor M18 transmits the high-level power supply voltage signal $VDD_A$ to the gate electrode of the nineteenth transistor M19, thereby controlling the nineteenth transistor M19 to be turned on. After the nineteenth transistor M19 is turned on, it may transmit the high-level power supply voltage signal $VDD_A$ to the first pull-down node $QB_A$ to charge the first pull-down node $QB_A$. When the pull-up node Q<N> is at a high level, the twentieth transistor M20 and the twenty-first transistor M21 are turned on. The twentieth transistor M20 transmits a low-level first voltage signal VGL1 provided by the first voltage signal terminal VGL1 to the gate electrode of the nineteenth transistor M19, so that the nineteenth transistor M19 is turned off. When the twenty-first transistor M21 is turned on, it may transmit the low-level first voltage signal VGL1 to the first pull-down node $QB_A$ to discharge the first pull-down node $QB_A$. The twenty-fourth transistor M24 is turned on under control of the high-level input signal STU provided by the input signal terminal STU, so that the twenty-fourth transistor M24 transmits the low-level first voltage signal VGL1 to the first pull-down node $QB_A$ to discharge the first pull-down node $QB_A$. When the potential of the node H is at a high level, the twenty-third transistor M23 is turned on to transmit the low-level first voltage signal VGL1 provided by the first voltage signal terminal VGL1 to the second electrode of the twenty-second transistor M22. When the clock signal CLKA provided by the clock signal terminal CLKA is also at a high level, the twenty-second transistor M22 is turned on to transmit the low-level first voltage signal VGL1 to the first pull-down node $QB_A$, so as to pull down the potential of the first pull-down node $QB_A$. During the display period, when the high-level input signal STU exists, the seventh transistor M7 and the eighth transistor M8 are turned on to charge the pull-up node Q<N>; when the pull-up node Q<N> is at the high level, the first pull-down node $QB_A$ needs to be at a low level; in this case, a potential relation between the pull-up node Q<N> and the first pull-down node $QB_A$ may be controlled through the twenty-fourth transistor M24. During the blanking period, when the clock signal CLKA provided by the clock signal terminal CLKA and the node H are at high levels, the pull-up node Q<N> is at a high level. Therefore, the potential relation between the pull-up node Q<N> and the first pull-down node $QB_A$ needs to be controlled through the twenty-second transistor M22 and the twenty-third transistor M23. When the pull-up node Q<N> is at the high level, the twentieth transistor M20 is turned on to turn off the nineteenth transistor M19, thereby making the power supply voltage signal terminal $VDD_A$ stop charging the first pull-down node $QB_A$. Meanwhile, the twenty-first transistor M21 is turned on to transmit the low-level first voltage signal VGL1 to the first pull-down node $QB_A$, so as to pull down the potential of the first pull-down node $QB_A$. Therefore, the control sub-circuit 1303 achieves control of the potentials of the pull-up node Q<N> and the first pull-down node $QB_A$.

The output sub-circuit 1304 is configured to output the first gate signal $G1_1$ and the second gate signal $G2_1$ during the blanking period of the frame, and to output the first gate signal $G1_2$ and the second gate signal $G2_2$ during the display period of the frame.

The output sub-circuit 1304 includes, for example, a twenty-fifth transistor M25, a twenty-eighth transistor M28, a thirty-first transistor M31, a second capacitor C2, and a third capacitor C3.

A gate electrode of the twenty-fifth transistor M25 is coupled to the pull-up node Q<N>, a first electrode of the twenty-fifth transistor M25 is coupled to the clock signal terminal $CLKD_1$, and a second electrode of the twenty-fifth transistor M25 is coupled to the cascade output signal terminal CR<N>. A gate electrode of the twenty-eighth transistor M28 is coupled to the pull-up node Q<N>, a first electrode of the twenty-eighth transistor M28 is coupled to the clock signal terminal $CLKE_1$, and a second electrode of the twenty-eighth transistor M28 is coupled to the first output signal terminal OUT1<N>. A gate electrode of the thirty-first transistor M31 is coupled to the pull-up node Q<N>, a first electrode of the thirty-first transistor M31 is coupled to the clock signal terminal $CLKF_1$, and a second electrode of the thirty-first transistor M31 is coupled to the second output signal terminal OUT2<N>. A terminal of the second capacitor C2 is coupled to the gate electrode of the twenty-eighth transistor M28, and another terminal of the second capacitor C2 is coupled to the first output signal terminal OUT1<N>. A terminal of the third capacitor C3 is coupled to the gate electrode of the thirty-first transistor M31, and another terminal of the third capacitor C3 is coupled to the second output signal terminal OUT2<N>. When the pull-up node Q<N> is at the high level, the twenty-fifth transistor M25, the twenty-eighth transistor M28, and the thirty-first transistor M31 are turned on. The twenty-fifth transistor M25 transmits a clock signal $CLKD_1$ provided by the clock signal terminal $CLKD_1$ to the cascade output signal terminal CR<N>, the twenty-eighth transistor M28 transmits a clock signal $CLKE_1$ provided by the clock signal terminal $CLKE_1$ to the first output signal terminal OUT1<N>, and a signal output from the first output signal terminal OUT1<N> is the first gate signal G1. The thirty-first transistor M31 transmits a clock signal $CLKF_1$ provided by the clock signal terminal $CLKF_1$ to the second output signal terminal OUT2<N>, and a signal output from the second output signal terminal OUT2<N> is the second gate signal G2. The second capacitor C2 is used to maintain a potential of the gate electrode of the twenty-eighth transistor M28, so that the twenty-eighth transistor M28 may be maintained in an on state and output the clock signal $CLKE_1$. The third capacitor C3 is used to maintain a potential of the gate electrode of the thirty-first transistor M31, so that the thirty-first transistor M31 may be maintained in an on state and output the clock signal $CLKF_1$. A cascade output signal CR<N> output by the cascade output signal terminal CR<N> is, for example, received by the first electrode of the first transistor M1, so that the cascade output signal is served as the input signal of the blanking input sub-circuit 1301.

Referring to FIG. 6, the output sub-circuit 1304 includes the first output signal terminal OUT1<N> and the second output signal terminal OUT2<N>. Referring to FIG. 2, the first output signal terminal OUT1<N> is configured to provide the first gate signal G1 to the first gate signal terminal G1, and the second output signal terminal OUT2<N> is configured to provide the second gate signal G2 to the second gate signal terminal G2. The first gate signal G1 and the second gate signal G2 may be the same or different on a premise that the pixel driving circuit 12 may work normally, which is not limited in the embodiments.

The reset sub-circuit 1305 is configured to reset the pull-up node Q<N>, the first pull-down node $QB_A$, the leakage prevention node OFF<N> and the output sub-circuit 1304. The reset sub-circuit 1305 includes, for example, a first reset sub-circuit $1305_1$ and a second reset sub-circuit $1305_2$. The first reset sub-circuit $1305_1$ is configured to reset the pull-up node Q<N>, the first pull-down node $QB_A$ and the output sub-circuit 1304. The second reset sub-circuit $1305_2$ is configured to reset the pull-up node Q<N> and the leakage prevention node OFF<N>.

The first reset sub-circuit $1305_1$ includes, for example, a fourteenth transistor M14, a fifteenth transistor M15, a sixteenth transistor M16, a seventeenth transistor M17, a twenty-sixth transistor M26, a twenty-seventh transistor M27, a twenty-ninth transistor M29, a thirtieth transistor M30, a thirty-second transistor M32, and a thirty-third transistor M33. A gate electrode of the fourteenth transistor M14 is coupled to the first pull-down node $QB_A$, a first electrode of the fourteenth transistor M14 is coupled to the leakage prevention node OFF<N>, and a second electrode of the fourteenth transistor M14 is coupled to the pull-up node Q<N>. A gate electrode of the fifteenth transistor M15 is coupled to the first pull-down node $QB_A$, a first electrode of the fifteenth transistor M15 is coupled to the first voltage signal terminal VGL1, and a second electrode of the fifteenth transistor M15 is coupled to the leakage prevention node OFF<N>. A gate electrode of the twenty-sixth transistor M26 is coupled to the first pull-down node $QB_A$, a first electrode of the twenty-sixth transistor M26 is coupled to the first voltage signal terminal VGL1, and a second electrode of the twenty-sixth transistor M26 is coupled to the cascade output signal terminal CR<N>. A gate electrode of the twenty-ninth transistor M29 is coupled to the first pull-down node $QB_A$, a first electrode of the twenty-ninth transistor M29 is coupled to the second voltage signal terminal VGL2, and a second electrode of the twenty-ninth transistor M29 is coupled to the first output signal terminal OUT1<N>. A gate electrode of the thirty-second transistor M32 is coupled to the first pull-down node $QB_A$, a first electrode of the thirty-second transistor M32 is coupled to the second voltage signal terminal VGL2, and a second electrode of the thirty-second transistor M32 is coupled to the second output signal terminal OUT2<N>. When the first pull-down node $QB_A$ is at the high level, the fourteenth transistor M14, the fifteenth transistor M15, the twenty-sixth transistor M26, the twenty-ninth transistor M29 and the thirty-second transistor M32 are all turned on. The fifteenth transistor M15 transmits the first voltage signal VGL1 provided by the first voltage signal terminal VGL1 to the leakage prevention node OFF<N> to reset the leakage prevention node OFF<N>. In this case, the potential of the leakage prevention node OFF<N> is at a low level, and the low-level signal is, for example, the same as the first voltage signal VGL1. When the fourteenth transistor M14 is turned on, it may transmit the low-level signal to the pull-up node Q<N> to reset the pull-up node Q<N>. When the twenty-sixth transistor M26 is turned on, it may transmit the first voltage signal VGL1 provided by the first voltage signal terminal VGL1 to the cascade output signal terminal CR<N> to reset the cascade output signal terminal CR<N>. When the twenty-ninth transistor M29 is turned on, it may transmit the second voltage signal VGL2 provided by the second voltage signal terminal VGL2 to the first output signal terminal OUT1<N> to reset the first output signal terminal OUT1<N>. When the thirty-second transistor M32 is turned on, it may transmit the second voltage signal VGL2 provided by the second voltage signal terminal VGL2 to the second output signal terminal OUT2<N> to reset the second output signal terminal OUT2<N>. When the second pull-down node QBe is at a high level, the sixteenth transistor M16, the seventeenth transistor M17, the twenty-seventh transistor M27, the thirtieth transistor M30, and the thirty-third transistor M33 are turned on. Functions of the sixteenth transistor M16 and the fourteenth transistor M14 are the same; functions of the seventeenth transistor M17 and the fifteenth transistor M15 are the same; functions of the twenty-seventh transistor M27 and the twenty-sixth transistor M26 are the same; functions of the thirtieth transistor M30 and the twenty-ninth transistor M29 are the same; functions of the thirty-third transistor M33 and the thirty-second transistor M32 are the same. Therefore, working processes of the sixteenth transistor M16, the seventeenth transistor M17, the twenty-seventh transistor M27, the thirtieth transistor M30 and the thirty-third transistor M33 may be understood with reference to the above description of the fourteenth transistor M14, the fifteenth transistor M15, the twenty-sixth transistor M26, the twenty-ninth transistor M29 and the thirty-second transistor M32.

The second reset sub-circuit $1305_2$ includes, for example, a twelfth transistor M12 and a thirteenth transistor M13. A gate electrode of the twelfth transistor M12 is coupled to the reset signal terminal STD, a first electrode of the twelfth transistor M12 is coupled to the leakage prevention node OFF<N>, and a second electrode of the twelfth transistor M12 is coupled to the pull-up node Q<N>. A gate electrode of the thirteenth transistor M13 is coupled to the reset signal terminal STD, a first electrode of the thirteenth transistor M13 is coupled to the first voltage signal terminal VGL1, and a second electrode of the thirteenth transistor M13 is coupled to the leakage prevention node OFF<N>. When the reset signal STD provided by the reset signal terminal STD is at a high level, the twelfth transistor M12 and the thirteenth transistor M13 are turned on. When the thirteenth transistor M13 is turned on, it may transmit the first voltage signal VGL1 provided by the first voltage signal terminal VGL1 to the leakage prevention node OFF<N> to reset the leakage prevention node OFF<N>. When the twelfth transistor M12 is turned on, it may transmit the low-level signal (e.g., the first voltage signal VGL1) at the leakage prevention node OFF<N> to the pull-up node Q<N> to reset the pull-up node Q<N>. It may also be understood that the first voltage signal VGL1 may be transmitted to the pull-up node Q<N> through the thirteenth transistor M13 and the twelfth transistor M12 together.

The global reset sub-circuit 1306 is configured to perform a reset on the pull-up node Q<N> and the leakage prevention node OFF<N> for a second time.

The global reset sub-circuit 1306 includes, for example, a ninth transistor M9 and a tenth transistor M10. A gate electrode of the ninth transistor M9 is coupled to the global reset signal terminal TRST, a first electrode of the ninth transistor M9 is coupled to a second electrode of the tenth transistor M10, and a second electrode of the ninth transistor M9 is coupled to the pull-up node Q<N>. A gate electrode of the tenth transistor M10 is coupled to the global reset signal terminal TRST, a first electrode of the tenth transistor M10 is coupled to the first voltage signal terminal VGL1, and the second electrode of the tenth transistor M10 is coupled to the leakage prevention node OFF<N>. When the global reset signal TRST provided by the global reset signal terminal TRST is at a high level, the ninth transistor M9 and the tenth transistor M10 are turned on. The tenth transistor M10 transmits the first voltage signal VGL1 provided by the first voltage signal terminal VGL1 to the leakage prevention node OFF<N> and the first electrode of the ninth transistor M9, so as to reset the leakage prevention node OFF<N>. In addition, the ninth transistor M9 may transmit the first voltage signal VGL1 to the pull-up node Q<N> to reset the pull-up node Q<N>.

The above is an explanation of a structure of the N-th-stage shift register 130. Referring to FIG. 6, a structure of the (N+1)-th-stage shift register is similar to the structure of the N-th-stage shift register. The N-th-stage shift register and the (N+1)-th-stage shift register share part of the thin film transistors. For example, referring to FIG. 6, the (N+1)-th-stage shift register 130 includes, for example: a thirty-fourth transistor M34, a thirty-fifth transistor M35, and a fortieth transistor M40 that are used to constitute a blanking input sub-circuit 1301, a thirty-sixth transistor M36 and a thirty-seventh transistor M37 that are used to constitute a display input sub-circuit 1302, a forty-seventh transistor M47, a forty-eighth transistor M48, a forty-ninth transistor M49, a fiftieth transistor M50, a fifty-first transistor M51, a fifty-second transistor M52 and a fifty-third transistor M53 that are used to constitute a control sub-circuit 1303, a fifty-fourth transistor M54, a fifty-seventh transistor M57, a fourth capacitor C4 and a fifth capacitor C5 that are used to constitute an output sub-circuit 1304, a forty-third transistor M43, a forty-fourth transistor M44, a forty-fifth transistor M45, a forty-sixth transistor M46, a fifty-fifth transistor M55, a fifty-sixth transistor M56, a fifty-eighth transistor M58, and a fifty-ninth transistor M59 that are used to constitute a first reset sub-circuit $1305_1$ of a reset sub-circuit 1305, a forty-first transistor M41 and a forty-second transistor M42 that are used to constitute a second reset sub-circuit $1305_2$, and a thirty-eighth transistor M38 and a thirty-ninth transistor M39 that are used to constitute a global reset sub-circuit 1306.

The blanking input sub-circuit 1301 in the (N+1)-th row and the blanking input sub-circuit in the N-th row share the first transistor M1, the second transistor M2, the third transistor M3, the fourth transistor M4 and the first capacitor C1, so that the number of the thin film transistors may be reduced.

The first pull-down node $QB_A$ in the N-th row is coupled to the first pull-down node $QB_A$ in the (N+1)-th row, and the second pull-down node $QB_B$ in the N-th row is coupled to the second pull-down node $QB_B$ in the (N+1)-th row. The first pull-down node $QB_A$ and the second pull-down node $QB_B$ in the N-th row are coupled to the external voltage signal terminal. Potentials of the first pull-down node $QB_A$ and the second pull-down node $QB_B$ may jump to high potentials through the external voltage signal terminal. In addition, since the first pull-down node $QB_A$ in the N-th row is coupled to the first pull-down node $QB_A$ in the (N+1)-th row, and the second pull-down node $QB_B$ in the N-th row is coupled to the second pull-down node $QB_B$ in the (N+1)-th row, the number of the thin film transistors may be reduced and working pressure of the thin film transistors may be reduced. Moreover, by providing a first pull-down node $QB_A$ and a second pull-down node $QB_B$ in each row, the two nodes may work alternately to reduce the working pressure of the thin film transistors.

With reference to FIGS. 5 and 6, in a frame, the display period precedes the blanking period. That is, the shift register 130 first outputs the first gate signal $G1_2$ and the second gate signal $G2_2$ to the pixel driving circuit 12, and then outputs the first gate signal $G1_1$ and the second gate signal $G2_1$ to the pixel driving circuit 12.

Referring to FIG. 6, for the N-th-stage shift register 130, during the display period, firstly, the global reset signal provided by the global reset signal terminal TRST is at a high level, and the global reset sub-circuit 1306 starts to work, which means that the ninth transistor M9 and the tenth transistor M10 are turned on to reset the pull-up node Q<N> and the leakage prevention node OFF<N>. The random signal OE provided by the random signal terminal OE is at a high level, and the first transistor M1 and the second transistor M2 are turned on. In this case, since there is no signal output from the cascade output signal terminal CR<N>, the potential of the node H is at a low level. The power supply voltage signal $VDD_A$ provided by the power supply voltage signal terminal $VDD_A$ is at a high level, and the eighteenth transistor M18 and the nineteenth transistor M19 in the control sub-circuit 1303 are turned on to charge the first pull-down node $QB_A$, so that the potential of the first pull-down node $QB_A$ is at a high level. Secondly, the input signal STU provided by the input signal terminal STU is at a high level, and the twenty-fourth transistor M24 is turned on to transmit the first voltage signal VGL1 to the first pull-down node $QB_A$, so that the potential of the first pull-down node $QB_A$ becomes at a low level. When the input signal STU is at the high level, the display input sub-circuit 1302 starts to work, which means that the seventh transistor M7 and the eighth transistor M8 are turned on to charge the pull-up node Q<N> and the leakage prevention node OFF<N>, so that the potentials of the pull-up node Q<N> and the leakage prevention node OFF<N> are at a high level. When the potential of the pull-up node Q<N> is at a high level, the twentieth transistor M20 and the twenty-first transistor M21 are turned on, so as to make the nineteenth transistor M19 be turned off and make the potential of the first pull-down node $QB_A$ continue to maintain at a low level. When the potential of the pull-up node Q<N> is at the high level, the twenty-fifth transistor M25, the twenty-eighth transistor M28 and the thirty-first transistor M31 are turned on, and each of the cascade output signal terminal CR<N>, the first output signal terminal OUT1<N> and the second output signal terminal OUT2<N> starts to output a signal. The signal output by the cascade output signal terminal CR<N> is, for example, an input signal STU of the (N+2)-th-stage shift register 130 or the (N+3)-th-stage shift register 130. The first output signal output by the first output signal terminal OUT1<N> is, for example, the first gate signal $G1_2$. The second output signal output by the second output signal terminal OUT2<N> is, for example, the second gate signal $G2_2$. When the potential of the pull-up node Q<N> is at the high level, the eleventh transistor M11 is turned on to transmit the power supply voltage signal VDD provided by the power supply voltage signal terminal VDD to the leakage prevention node OFF<N>, so that the potential of the leakage prevention node OFF<N> is at a high level. In this case, for the sixth transistor M6, since the first electrode of the sixth transistor M6 is coupled to the leakage prevention node OFF<N>, the first electrode thereof is at a high level. Since the second electrode of the sixth transistor M6 is coupled to the pull-up node Q<N>, the second electrode thereof is also at a high level. As a result, it can prevent charges of the pull-up node Q<N> from leaking through the sixth transistor M6, and achieve the function of leakage prevention. When the clock signal $CLKD_1$ provided by the clock signal terminal $CLKD_1$ is at a high level, and the random signal OE is also at a high level, the blanking input sub-circuit 1301 charges the node H through the first transistor M1 and the second transistor M2. Due to an existence of the first capacitor C1, the high level of the node H may be maintained for a period of time. When the potential of the node H is at the high level, the fourth transistor M4 and the twenty-third transistor M23 are turned on. Since the clock signals CLKA provided by the clock signal terminal CLKA are all at a low level during the entire display period, the potential of the node N<N> coupled to the second electrode of the fourth transistor M4 is always at a low level during the display period, and the fifth transistor M5 and the sixth transistor M6 are maintained in off states during the display period. When there is no signal output from the sixth transistor M6, the eleventh transistor M11 is in an off state. Finally, when the reset signal STD provided by the reset signal terminal STD is at a high level, the twelfth transistor M12 and the thirteenth transistor M13 are turned on to reset the pull-up node Q<N> and the leakage prevention node OFF<N>, so that potentials of the pull-up node Q<N> and the leakage prevention node OFF<N> become at a low level. When the potential of the pull-up node Q<N> becomes at a low level, the cascade output signal terminal CR<N>, the first output signal terminal OUT1<N> and the second output signal terminal OUT2<N> stop outputting signals. Moreover, since the power supply voltage signal $VDD_A$ is at a high level, the potential of the first pull-down node $QB_A$ returns to be at a high level. When the potential of the first pull-down node $QB_A$ is at the high level, the fourteenth transistor M14, the fifteenth transistor M15, the twenty-sixth transistor M26, the twenty-ninth transistor M29, and the thirty-second transistor M32 are turned on. The fourteenth transistor M14 and the fifteenth transistor M15 may transmit the first voltage signal VGL1 to the pull-up node Q<N> and the leakage prevention node OFF<N>, so as to reset the pull-up node Q<N> and the leakage prevention node OFF<N>. The twenty-sixth transistor M26 may transmit the first voltage signal VGL1 to the cascade output signal terminal CR<N> to reset the cascade output signal terminal CR<N>. The twenty-ninth transistor M29 and the thirty-second transistor M32 may respectively transmit low-level second voltage signals VGL2 provided by the second voltage signal terminal VGL2 to the first output signal terminal OUT1<N> and the second output signal terminal OUT2<N>, so as to reset the first output signal terminal OUT1<N> and the second output signal terminal OUT2<N>. The display period ends.

During the blanking period, since the clock signal CLKA is at a high level, and the potential of the node H may be maintained until the blanking period, the fourth transistor M4 may output a high-level signal to the node N<N>, and the potential of the node N<N> is at a high level. Since potentials of the clock signal CLKA and node H are at a high level, the twenty-third transistor M23 and the twenty-second transistor M22 are both turned on to transmit the low-level first voltage signal VGL1 provided by the first voltage signal terminal VGL1 to the first pull-down node $QB_A$, so that the potential of the first pull-down node $QB_A$ becomes at a low level. Since the clock signal CLKA is at the high level, the fifth transistor M5 and the sixth transistor M6 are turned on to transmit the signal of the node N<N> to the pull-up node Q<N>, so that the potential of the pull-up node Q<N> becomes at a high level. After the potential of the pull-up node Q<N> becomes at the high level, the first output signal terminal OUT1<N> starts to output the first gate signal $G1_1$, and the second output signal terminal OUT2<N> starts to output the second gate signal $G2_1$, the clock signal $CLKD_1$ is at the low level, the clock signal $CLKE_1$ is at the high level and the clock signal $CLKF_1$ is at the high level.

When the external voltage signal terminal makes the second pull-down node $QB_B$ be at a high level, the sixteenth transistor M16, the seventeenth transistor M17, the twenty-seventh transistor M27, the thirtieth transistor M30 and the thirty-third transistor M33 are turned on. The sixteenth transistor M16 and the seventeenth transistor M17 may transmit the first voltage signals VGL1 to the pull-up node Q<N> and the leakage prevention node OFF<N> to reset the pull-up node Q<N> and the leakage prevention node OFF<N>. The twenty-seventh transistor M27 may transmit the first voltage signal VGL1 to the cascade output signal terminal CR<N> to reset the cascade output signal terminal CR<N>. The thirtieth transistor M30 and the thirty-third transistor M33 may respectively transmit second voltage signals VGL2 to the first output signal terminal OUT1<N> and the second output signal terminal OUT2<N> to reset the first output signal terminal OUT1<N> and the second output signal terminal OUT2<N>.

In the above frame, the clock signal CLKE is the same as the clock signal CLKF. The first voltage signal VGL1 and the second voltage signal VGL2 are, for example, always low-level signals. The power supply voltage signal VDD is always a high-level signal. Therefore, they are not shown in FIG. 5. In a frame, the first voltage signal VGL1 and the second voltage signal VGL2 are both low-level voltage signals, and the two signals may be the same or different, which is not limited in the embodiments.

Those skilled in the art may understand that, the high level and the low level are relative values. For example, a potential at the high level is 15 V and a potential at the low level is 5 V. Therefore, the potential at the low level is not limited to a potential at a level less than or equal to 0 V.

The timing diagram shown in FIG. 5 corresponds to a situation where the thin film transistors in the shift register 130 are all N-type transistors, which is only served as an example.

Figure 7:
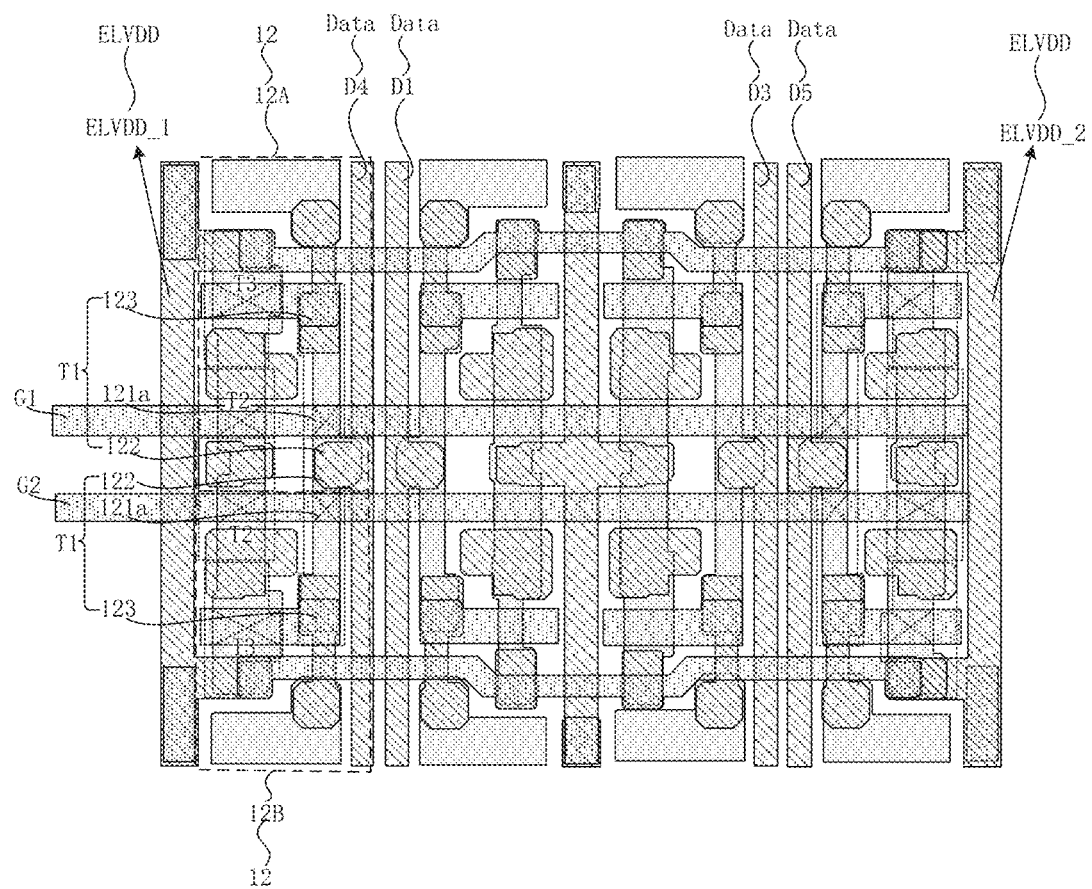
FIG. 7 is a top view showing a structure of a driving backplane, in accordance with some embodiments.
Figure 8:
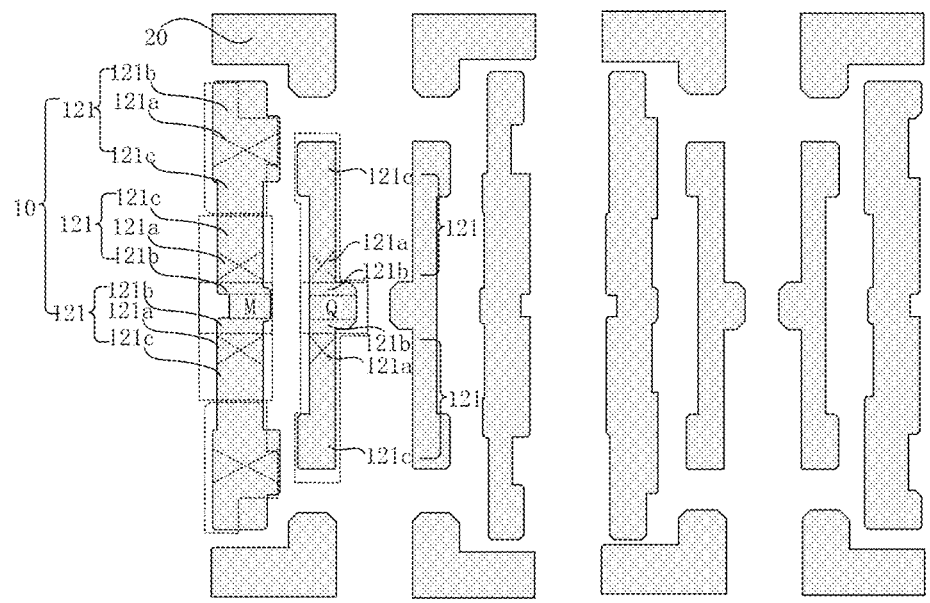
FIG. 8 is a top view showing a structure of active layer patterns, in accordance with some embodiments.
Figure 9:
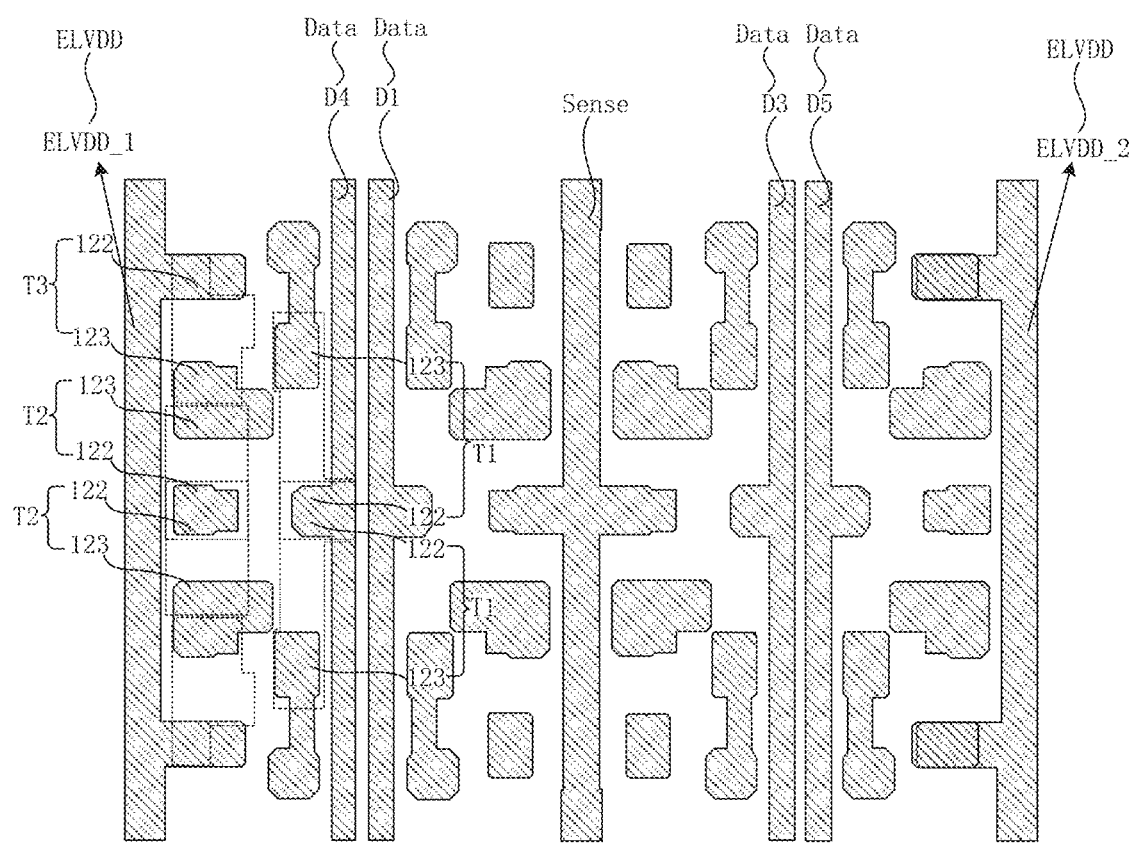
FIG. 9 is a top view showing a structure of a source-drain (SD) metal layer, in accordance with some embodiments.

In some embodiments, referring to FIGS. 7, 8, and 9, the plurality of gate lines Gate includes a first gate line G1 and a second gate line G2 that are adjacent. A first transistor T1 in each pixel driving circuit 12 includes an active layer 121. The active layer 121 includes an active portion 121a, a first conductive portion 121b and a second conductive portion 121c. Active layers 121 of first transistors T1 in the plurality of pixel driving circuits 12 further includes first contact portions Q. The plurality of pixel driving circuits 12 include a first pixel driving circuit 12A coupled to a data line Data and a first gate line G1, and a second pixel driving circuit 12B coupled to the data line Data and a second gate line G2. A first conductive portion 121b of a first transistor T1 in the first pixel driving circuit 12A and a first conductive portion 121b of a first transistor T1 in the second pixel driving circuit 12B are in contact through the first contact portion Q, and are coupled to the data line Data through the first contact portion Q.

The first conductive portion 121b and the second conductive portion 121c may be a source region and a drain region, respectively. The source region is a region used for coupling with a source electrode after semiconductor materials in the active layer 121 are converted into conductors. The drain region is a region used for coupling with a drain electrode after the semiconductor materials in the active layer 121 are converted into the conductors.

Here, in an example where the first conductive portion 121b is the source region, the first conductive portion 121b of the first transistor T1 is the source region of the first transistor T1. A description that the first conductive portion 121b of the first transistor T1 in the first pixel driving circuit 12A and the first conductive portion 121b of the first transistor T1 in the second pixel driving circuit 12B through the first contact portion Q are in contact, and are coupled to the data line Data through the first contact portion Q, means that: the first conductive portion 121b of the first transistor T1 in the first pixel driving circuit 12A may be regarded as a portion located between the first contact portion Q and an active portion 121a of the first transistor T1 in the first pixel driving circuit 12A in FIG. 8, and the first conductive portion 121b of the first transistor T1 in the second pixel driving circuit 12B may be regarded as a portion located between the first contact portion Q and the active portion 121a of the first transistor T1 in the second pixel driving circuit 12B in FIG. 8; and the first contact portion Q is in contact with the two first conductive portions 121b, thereby achieving the coupling of the two first conductive portions 121b with the data line Data.

In some embodiments, the first contact portion Q may be regarded as part of the first conductive portion 121b. In this case, the first conductive portion 121b of the first transistor T1 in the first pixel driving circuit 12A may also be used as the first conductive portion 121b of the first transistor T1 in the second pixel driving circuit 12B. That is, as shown in FIG. 8, a portion located between the active portion 121a of the first transistor T1 in the first pixel driving circuit 12A and the active portion 121a of the first transistor T1 in the second pixel driving circuit 12B may be regarded as a large first conductive portion 121b, which may be served as the first conductive portion 121b of the first transistor T1 in the first pixel driving circuit 12A, and may also be served as the first conductive portion 121b of the first transistor T1 in the second pixel driving circuit 12B.

With reference to FIGS. 7 and 8, in some embodiments, the second transistor T2 and the third transistor T3 in the pixel driving circuit 12 may each, for example, include an active layer 121 disposed in a same layer as the active layer 121 of the first transistor T1. The active layer 121 of the second transistor T2 and the active layer 121 of the third transistor T3 may each also include an active portion 121a, a first conductive portion 121b, and a second conductive portion 121c.

In addition, the active layer 121 of the second transistor T2 may further include a second contact portion M. A first conductive portion 121b of a second transistor T2 in the first pixel driving circuit 12A is in contact with a first conductive portion 121b of a second transistor T2 in the second pixel driving circuit 12B through the second contact portion M, and the second contact portion M is located between the first gate line G1 and the second gate line G2. The first conductive portion 121b and the second conductive portion 121c of the second transistor T2 here have the same meanings as the first conductive portion 121b and the second conductive portion 121c of the first transistor T1 described above, respectively, which will not be repeated herein. In addition, similar to the first transistor T1, a description that the first conductive portion 121b of the second transistor T2 in the first pixel driving circuit 12A is in contact with the first conductive portion 121b of the second transistor T2 in the second pixel driving circuit 12B through the second contact portion M has the same meaning as the description that the first conductive portion 121b of the first transistor T1 in the first pixel driving circuit 12A is in contact with the first conductive portion 121b of the first transistor T1 in the second pixel driving circuit 12B through the first contact portion Q, and it means that the first conductive portion 121b of the second transistor T2 in the first pixel driving circuit 12A is also used as the first conductive portion 121b of the second transistor T2 in the second pixel driving circuit 12B.

In some embodiments, with reference to FIGS. 7, 8, 9, and 10, each of the second transistor T2 and the third transistor T3 may further include a first electrode 122 and a second electrode 123 that are disposed in a same layer as the data lines Data besides the active layer 121 described above. The storage capacitor Cst includes a first electrode C1 and a second electrode C2.

The first transistor T1, the second transistor T2, and the third transistor T3 may all be bottom-gate thin film transistors or top-gate thin film transistors, which are not specifically limited herein. The following embodiments are described by taking an example in which the first transistor T1, the second transistor T2, and the third transistor T3 are all top-gate thin film transistors.

The "same layer" described above refers to a layer structure that is formed by performing, using a mask, a single patterning process on a film layer for forming specific patterns which was formed by a film forming process. Depending on different specific patterns, the single patterning process may include several exposure, development or etching processes, and the specific patterns in the formed layer structure may be continuous or discontinuous, and these specific patterns may also be at different heights or have different thicknesses.

For example, the active layer 121 of the second transistor T2 and the active layer 121 of the third transistor T3 are disposed in a same layer as the active layer 121 of the first transistor T1, which means that the active layer 121 of the first transistor T1, the active layer 121 of the second transistor T2, and the active layer 121 of the third transistor T3 are formed through a single patterning process using a mask to obtain the structure shown in FIG. 8. The first electrode 122 and the second electrode 123 of the second transistor T2 and the first electrode 122 and the second electrode 123 of the third transistor T3 are disposed in a same layer as the data lines Data, which means that the first electrode 122 and the second electrode 123 of the second transistor T2, the first electrode 122 and the second electrode 123 of the third transistor T3, and the data lines Data are formed through a single patterning process using a mask to obtain the structure shown in FIG. 9.

Herein, according to a situation that the active layer 121 of the second transistor T2 and the active layer 121 of the third transistor T3 are disposed in the same layer as the active layer 121 of the first transistor T1, it will be seen that, as shown in FIG. 8, the plurality of pixel driving circuits 12 may include an active layer pattern 10. The active layer 121 of the first transistor T1, the active layer 121 of the second transistor T2, and the active layer 121 of the third transistor T3 all belong to the active layer pattern 10.

Figure 10:
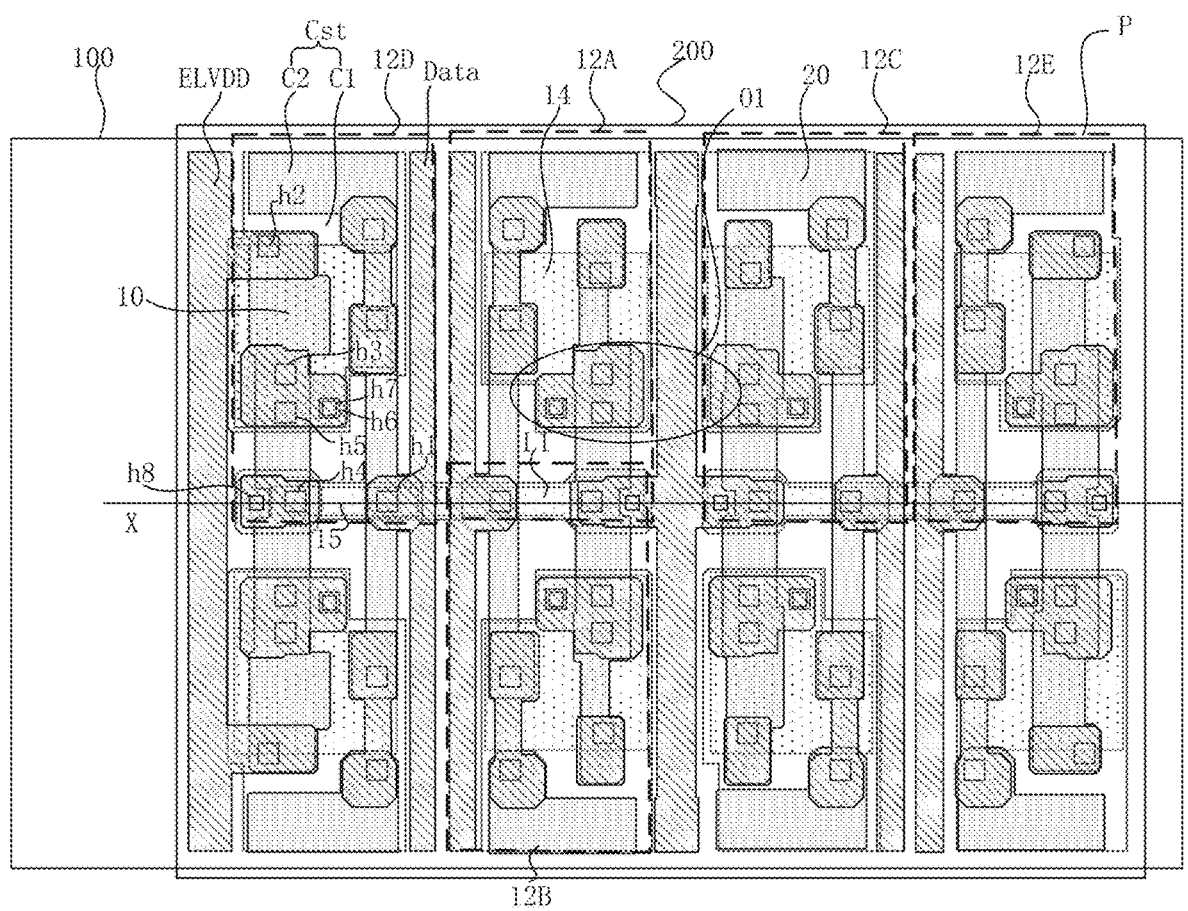
FIG. 10 is a top view showing a structure of a driving backplane, in accordance with some other embodiments.

In some embodiments, as shown in FIG. 10, the driving backplane 1 further includes first insulating layer(s) 100 disposed between the active layer pattern 10 and the data lines Data. Here, in an example where the first transistor T1, the second transistor T2 and the third transistor T3 are all top-gate transistors, the first insulating layer(s) 100 may include a gate insulating layer and an interlayer insulating layer. In this case, the gate insulating layer may be arranged in a whole layer. Alternatively, the first insulating layer(s) 100 may only include the interlayer insulating layer. In this case, the gate insulating layer may only be arranged in a region corresponding to gates. As shown in FIG. 10, the first insulating layer(s) 100 are provided with a plurality of first via holes h1, a plurality of second via holes h2, a plurality of third via holes h3, a plurality of fourth via holes h4, a plurality of fifth via holes h5 and a plurality of sixth via holes h6. With reference to FIGS. 7, 8, 9, 10, and 11, the first contact portion Q may be coupled to the respective data line Data through a first via hole h1. The first electrode 122 of the third transistor T3 is configured to be coupled to the power line ELVDD, and is coupled to the first conductive portion 121*b* of the third transistor T3 through a second via hole h2. The second electrode 123 of the third transistor T3 is coupled to the second conductive portion 121*c* of the third transistor T3 through a third via hole h3. The first electrode 122 of the second transistor T2 is coupled to the first conductive portion 121*b* of the second transistor T2 through a fourth via hole h4. The second electrode 123 of the second transistor T2 is coupled to the second conductive portion 121*c* of the second transistor T2 through a fifth via hole h5.

According to a situation that the first conductive portion 121*b* of the second transistor T2 in the first pixel driving circuit 12A is also used as the first conductive portion 121*b* of the second transistor T2 in the second pixel driving circuit 12B, it will be seen that the second contact portion M may also be coupled to the first electrode 122 of the second transistor T2 through a fourth via hole h4. In this case, the first electrode 122 of the second transistor T2 in the first pixel driving circuit 12A is also used as the first electrode 122 of the second transistor T2 in the second pixel driving circuit 12B.

In some embodiments, with reference to FIGS. 7, 8, 9, and 10, a straight line X that passes through first conductive portions 121*b* of first transistors T1 in the first pixel driving circuit 12A and the second pixel driving circuit 12B and is perpendicular to the data line Data is made. The first pixel driving circuit 12A is mirror-symmetrical to the second pixel driving circuit 12B with respect to the straight line X.

That is, portions of a pixel driving circuit 12 except for the first electrode 122 and the first conductive portion 121*b* of the first transistor T1, and the first electrode 122 and the first conductive portion 121*b* of the second transistor T2 are located at a side of the pixel driving circuit 12 away from the first gate line G1 and the second gate line G2.

Figure 12:
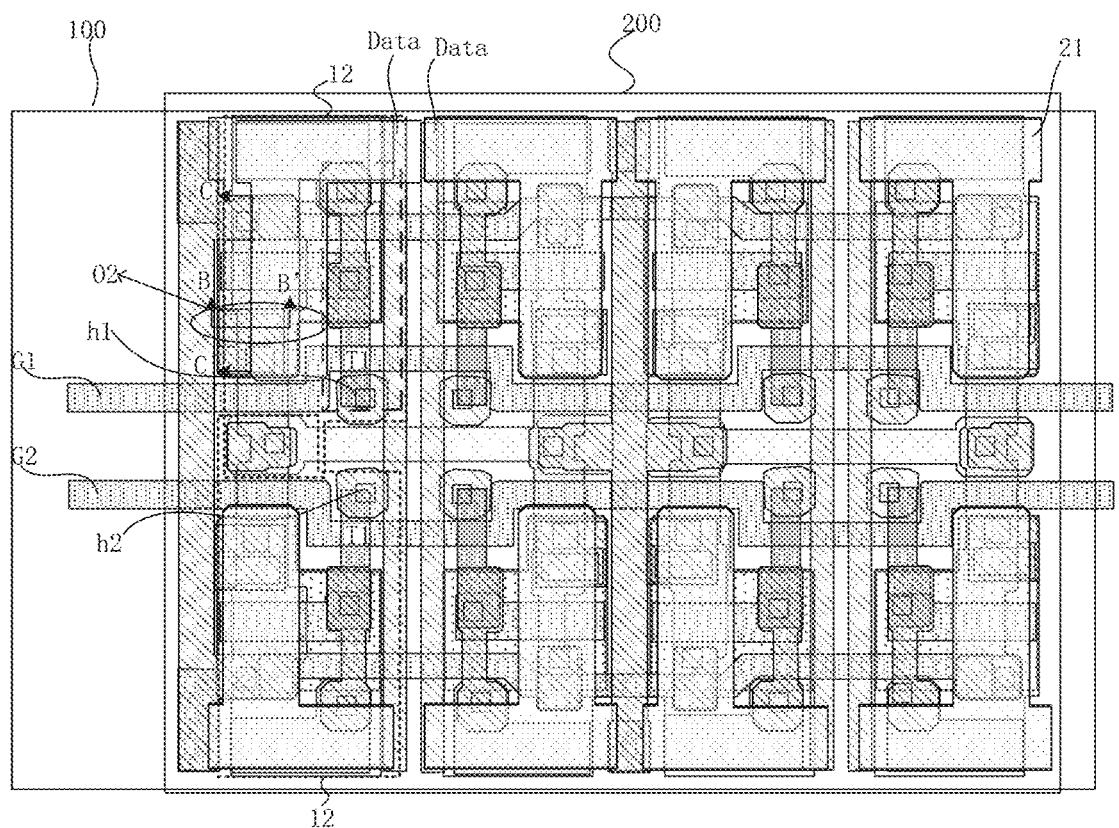
FIG. 12 is a top view showing a structure of a display panel of some embodiments in the related art.

In the embodiments of the present disclosure, since the first electrode 122 and the first conductive portion 121*b* of the first transistor T1, and the first electrode 122 and the first conductive portion 121*b* of the second transistor T2 in the pixel driving circuit 12 are all located between the first gate line G1 and the second gate line G2, and the first transistors T1 in two adjacent pixel driving circuits 12 share a first conductive portion 121*b* and a first electrode 122, the first conductive portion 121*b* of the first transistors T1 in the two adjacent pixel driving circuits 12 can be coupled to the data line Data only through a single first via hole h1 provided in the first insulating layer(s) 100. Compared with a situation in the related art as shown in FIG. 12 where first conductive portions 121*b* and first electrodes 122 of first transistors T1 in two adjacent pixel driving circuits 12 are each coupled to a data line Data through a respective first via hole h1 and the first gate lines G1 and the second gate lines G2 require to bypass the wires, it can free up more design space for the adjacent pixel driving circuits 12, so as to achieve a high PPI. It is especially suitable for a situation where a gate driver circuit 13 is designed in a display area in order to achieve a narrow bezel. Compared with a situation where a gate driver circuit 13 is designed in the display area in order to achieve the narrow bezel in the related art, which greatly reduces a space for pixel driving circuits 12, it may be possible to reserve a large design space for the pixel driving circuits 12 as much as possible, so as to solve problems such as a poor manufacturing process caused by the very limited design space for the pixel driving circuits 12.

Figure 16:
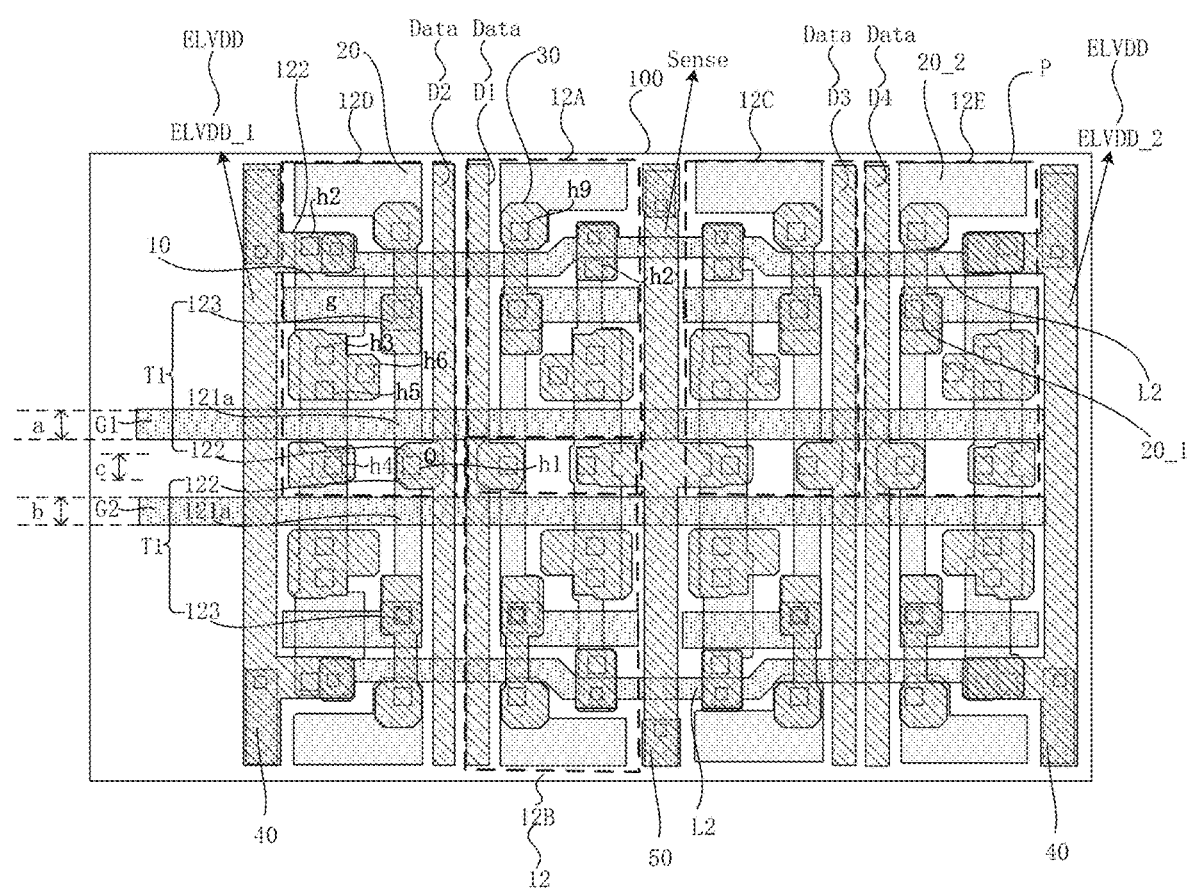
FIG. 16 is a top view showing a structure of a driving backplane, in accordance with some other embodiments.

Based on the above structures, in some embodiments, as shown in FIG. 16, an orthographic projection of at least one of the first gate line G1 and the second gate line G2 on a plane where a reference side face of the driving backplane 1 is located does not overlap with an orthographic projection of the first contact portion Q on the plane where the reference side face of the driving backplane 1 is located. The reference side face of the driving backplane 1 is a side face of the driving backplane 1 parallel to the data line Data.

As shown in FIG. 16, an orthographic projection of a first gate line G1 on the plane where the reference side face of the driving backplane 1 is located may be as shown by the arrow a. An orthographic projection of the second gate line G2 on the plane where the reference side face of the driving backplane 1 is located may be as shown by the arrow b. The orthographic projection of the first contact portion Q on the plane where the reference side face of the driving backplane 1 is located may be as shown by the arrow c. A description that the orthographic projection of at least one of the first gate line G1 and the second gate line G2 on the plane where the reference side face of the driving backplane 1 is located does not overlap with the orthographic projection of the first contact portion Q on the plane where the reference side face of the driving backplane 1 is located means that the arrow a does not overlap with the arrow c, or the arrow b does not overlap with the arrow c, or the arrow a, the arrow b, and the arrow c do not overlap with each other.

With reference to FIGS. 12 and 16, the orthographic projection of the first gate line G1 on the plane where the reference side face of the driving backplane 1 is located does not overlap with the orthographic projection of the first contact portion Q on the plane where the reference side face of the driving backplane 1 is located; a portion of the first gate line G1 located between the first pixel driving circuit 12A and the second pixel driving circuit 12B is a straight line, which may increase a design area of the first pixel driving circuit 12A. With reference to FIGS. 12 and 16, the orthographic projection of the second gate line G2 on the plane where the reference side face of the driving backplane 1 is located does not overlap with the orthographic projection of the first contact portion Q on the plane where the reference side face of the driving backplane 1 is located; a portion of the second gate line G2 located between the first pixel driving circuit 12A and the second pixel driving circuit 12B is a straight line, which may increase a design area of the second pixel driving circuit 12B. With reference to FIGS. 12 and 16, orthographic projections of the first gate line G1 and the second gate line G2 on the plane where the reference side face of the driving backplane 1 is located do not overlap with the orthographic projection of the first contact portion Q on the plane where the reference side face of the driving backplane 1 is located; portions of the first gate line G1 and the second gate line G2 located between the first pixel driving circuit 12A and the second pixel driving circuit 12B are straight lines, which may increase the design areas of the first pixel driving circuit 12A and the second pixel driving circuit 12B.

In some embodiments, with reference to FIGS. 7 to 11 and 17, first electrodes C1 of storage capacitors Cst in the pixel driving circuits 12 are located at a side of active layers (the active layer pattern 10) of first transistors T1 proximate to the base substrate 11. The driving backplane 1 further includes a second insulating layer 200 disposed between the active layer pattern 10 and the first electrodes C1 of the storage capacitors Cst. The second insulating layer 200 is provided with a plurality of seventh via holes h7, and each seventh via hole h7 is communicated with a respective sixth via hole h6. A first electrode C1 of a storage capacitor Cst is coupled to a second electrode 123 of a respective second transistor T2 and/or a second electrode 123 of a respective third transistor T3 through both a sixth via hole h6 and a seventh via hole h7 communicated with the sixth via hole h6. That is, the first electrode C1 of the storage capacitor Cst may receive the same electrical signal as the second electrode 123 of the second transistor T2 and the second electrode 123 of the third transistor T3. In an equivalent circuit diagram, as shown in FIG. 2, the first electrode C1 of the storage capacitor Cst, the second electrode 123 of the second transistor T2 and the second electrode 123 of the third transistor T3 may be coupled to the node S.

Figure 11:
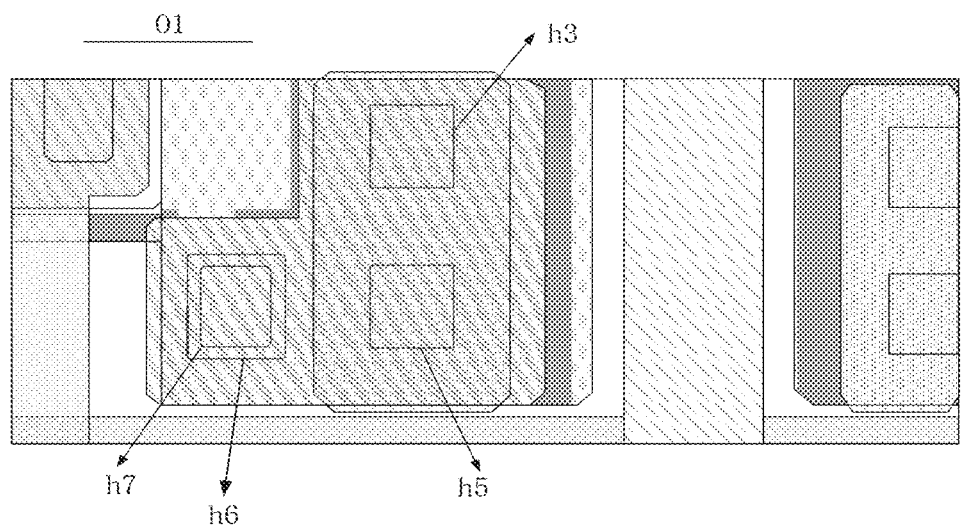
FIG. 11 is a partial enlarged view of the region 01 in FIG. 10, in accordance with some embodiments.

In some embodiments, as shown in FIGS. 10 and 11, an orthogonal projection of the sixth via hole h6 on the base substrate 11 does not overlap with orthogonal projections of the third via hole h3 and the fifth via hole h5 on the base substrate 11.

Figure 13:
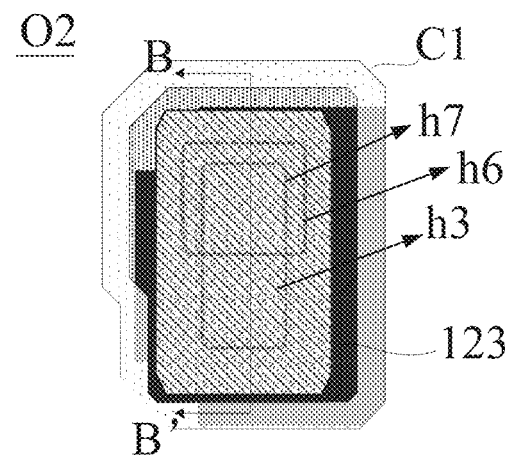
FIG. 13 is a partial enlarged view based on the region 02 in FIG. 12 in the related art.
Figure 14:
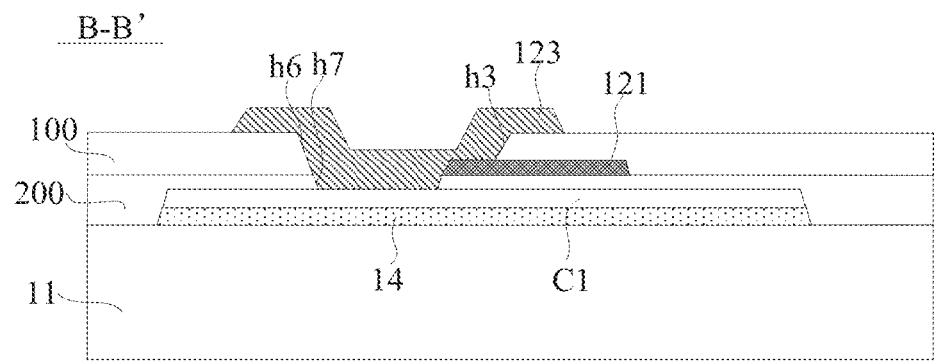
FIG. 14 is a structural sectional view taken along the B-B' direction in FIG. 12 in the related art.

As shown in FIGS. 12, 13, and 14, in the related art, the orthogonal projection of the sixth via hole h6 on the base substrate 11 overlaps with the orthogonal projection of the third via hole h3 on the base substrate 11, and during the etching process, an overlapping portion between the sixth via hole h6 and the third via hole h3 may be etched away simultaneously; moreover, the seventh via hole h7 corresponding to the sixth via hole h6 has a large etching depth, and the sixth via hole h6 and the third via hole h3 are too close, which causes that a large etching difference is needed. As a result, a portion of the seventh via hole h7 cannot be completely etched away, which is also related to a small size of the sixth via hole h6 limited by a space.

Figure 17:
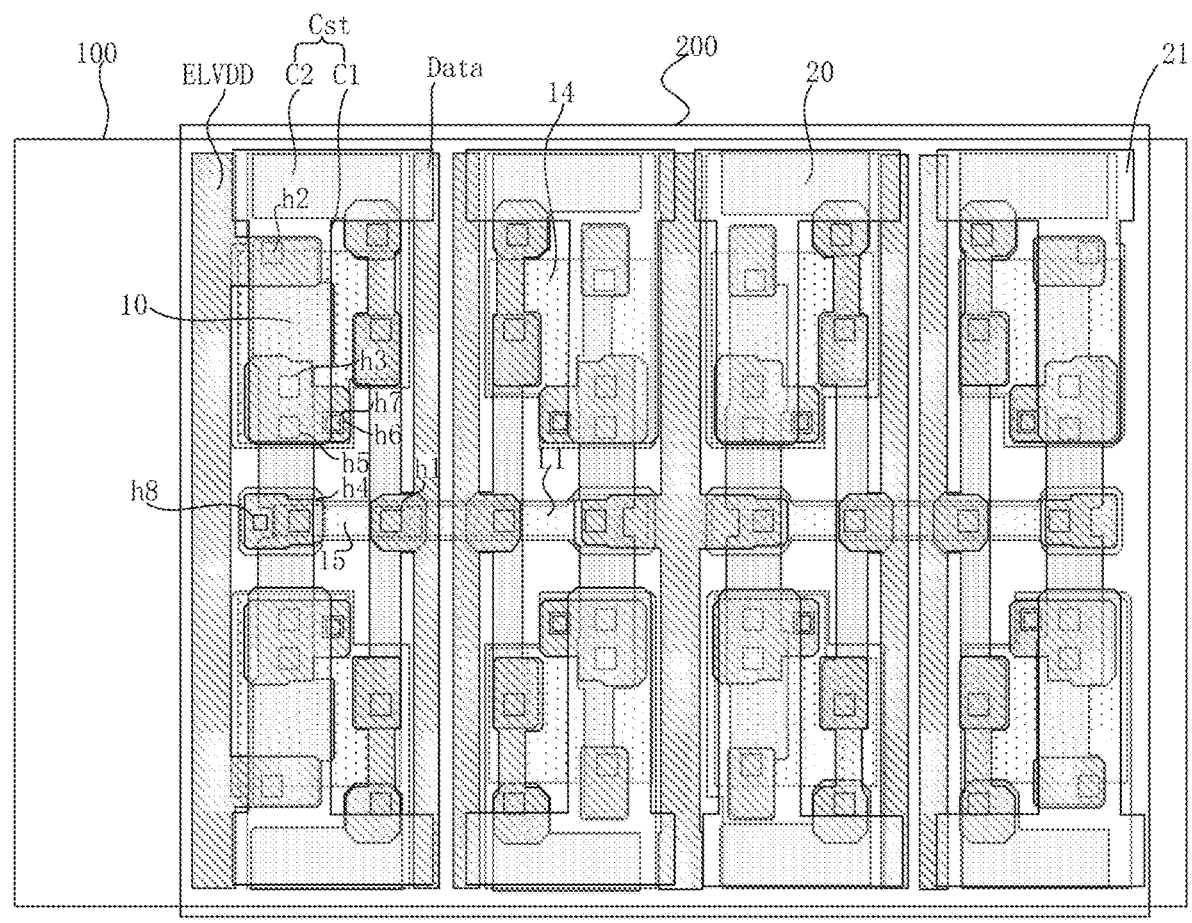
FIG. 17 is a top view showing a structure of a display panel, in accordance with some other embodiments.

Herein, depending on whether light emitted by driven devices 2 exits from a side away from the base substrate 11 or from the base substrate 11, there are two possible situations. In a first situation, light emitted by the driven devices 2 exits from the side away from the base substrate 11, and the first electrodes C1 of the storage capacitors Cst may be made of metal materials or transparent materials (in which case, the first electrodes C1 may be, for example, ITO electrodes). In this case, orthographic projections of the first electrodes C1 of the storage capacitors Cst on the base substrate 11 may overlap with orthographic projections of the driven devices 2 on the base substrate 11, which may increase an aperture ratio and increase storage capacities of the capacitors. In a second situation, the light emitted by the driven devices 2 exits from the base substrate 11, and the first electrodes C1 of the storage capacitors Cst are transparent electrodes (such as the ITO electrodes). In this case, the orthographic projections of the first electrodes C1 of the storage capacitors Cst on the base substrate 11 overlap with the orthographic projections of the driven devices 2 on the base substrate 11 (anodes 21 of the driven devices 2 are shown in FIGS. 17 and 19 with reference to FIGS. 17, 18, and 19). In this case, overlapping regions between the orthographic projections of the first electrodes C1 of the storage capacitors Cst on the base substrate 11 and the orthographic projections of the driven devices 2 on the base substrate 11 may be light-emitting regions. In this way, it is also possible to increase the storage capacity of the capacitor while increasing the aperture ratio.

Figure 18:
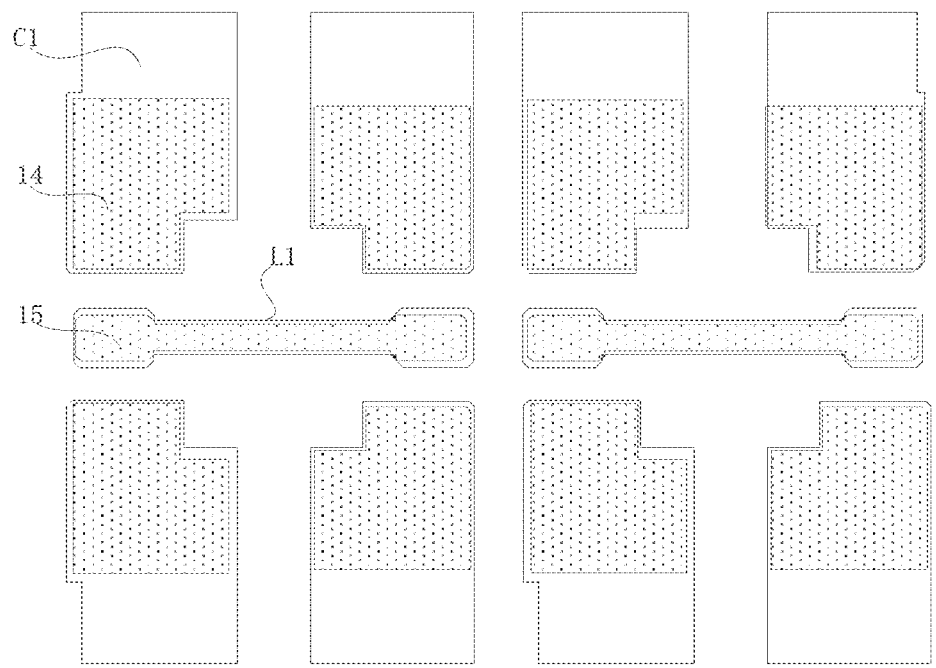
FIG. 18 is a top view showing a structure of light-shielding patterns and first electrodes of storage capacitors, in accordance with some embodiments.
Figure 19:
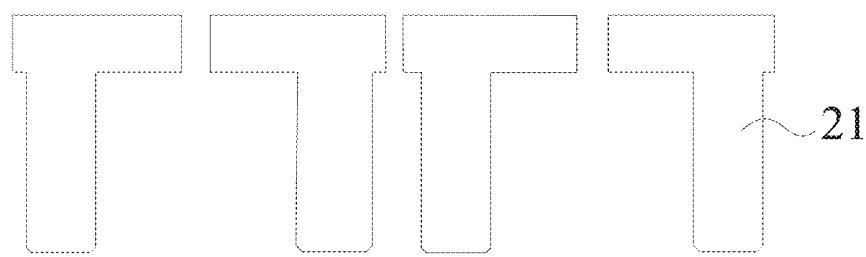
FIG. 19 is a top view showing a structure of anodes of driven devices, in accordance with some embodiments.
Figure 19:
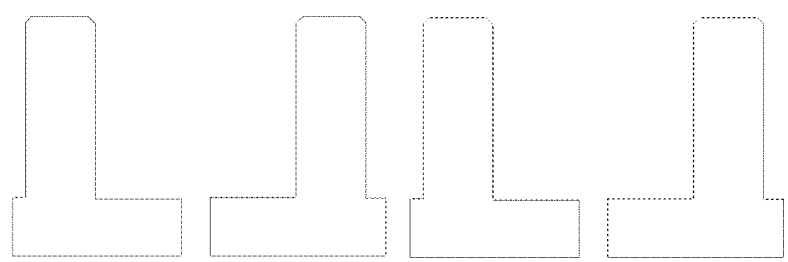

In some other embodiments, with reference to FIGS. 17 and 18, the driving backplane 1 may further include light-shielding patterns 14 disposed on the base substrate 11. The light-shielding patterns 14 may be disposed at a side of the first electrodes C1 proximate to the base substrate 11 and in direct contact with respective first electrodes C1. It is also possible to reduce the impedance of the first electrodes C1 while achieving light shielding.

In some other embodiments, as shown in FIGS. 8, 10, 16, and 17, second electrodes C2 of the storage capacitors Cst are conductive patterns 20 in a same layer as the active layer 121 of the first transistor T1. In a case where the light emitted by the driven devices exits from the base substrate 11, the conductive patterns 20 are transparent patterns, and orthographic projections of the conductive patterns 20 on the base substrate 11 overlap with the orthographic projections of the driven devices on the base substrate 11. In this case, the second electrodes C2 of the storage capacitors Cst are directly opposite respective driven devices. In this way, it may be possible to increase the aperture ratio as much as possible while increasing the capacitance.

The same layer here has the same meaning as the same layer described above, which will not be repeated here. For example, as shown in FIG. 8, the conductive patterns 20 and the active layer pattern 10 may be formed through a patterning process using a mask. The conductive patterns 20 here may be formed by the same conductive process as the first conductive portions 121b and the second conductive portions 121c.

In some embodiments, as shown in FIGS. 10 and 16, the driving backplane 1 further includes: a third pixel driving circuit 12C and a fourth pixel driving circuit 12D that are adjacent to the first pixel driving circuit 12A in a direction along which the first gate line G1 extends, a fifth pixel driving circuit 12E adjacent to the third pixel driving circuit 12C in the direction along which the first gate line G1 extends, and a sensing signal line Sense disposed between the third pixel driving circuit 12C and the first pixel driving circuit 12A. The data lines Data includes a first data line D1 and a second data line D2 that are disposed between the first pixel driving circuit 12A and the fourth pixel driving circuit 12D, and a third data line D3 and a fourth data line D4 that are disposed between the fifth pixel driving circuit 12E and the third pixel driving circuit 12C. The sensing signal line Sense and the data lines Data are disposed in a same layer.

The same layer here has the same meaning as the same layer described above, which will not be repeated herein. For example, the sensing signal line sense and the data lines Data are formed through a same patterning process using a mask.

In the direction along which the first gate lines G1 extend, the third pixel driving circuit 12C and the fourth pixel driving circuit 12D are adjacent to the first pixel driving circuit 12A, and the fifth pixel driving circuit 12E is adjacent to the third pixel driving circuit 12C. According to a situation that a sub-pixel P includes a pixel driving circuit 12 and a driven device, it will be seen that, the first pixel driving circuit 12A, the third pixel driving circuit 12C, the fourth pixel driving circuit 12D, and the fifth pixel driving circuit 12E belong to a same row of sub-pixels P, and they are arranged in an order from left to right as: the fourth pixel driving circuit 12D, the first pixel driving circuit 12A, the third pixel driving circuit 12C, and the fifth pixel driving circuit 12E.

The first data line D1 is coupled to the first conductive portion 121b of the first transistor T1 in the first pixel driving circuit 12A. The second data line D2 is coupled to a first conductive portion 121b of a first transistor T1 in the fourth pixel driving circuit 12D. The third data line D3 is coupled to a first conductive portion 121b of a first transistor T1 in the third pixel driving circuit 12C. The fourth data line D4 is coupled to a first conductive portion 121b of a first transistor T1 in the fifth pixel driving circuit 12E.

According to a situation that a data line Data may belong to a part of a sub-pixel P to which a respective pixel driving circuit 12 belongs, it will be seen that, the first data line D1 belongs to a part of a sub-pixel P to which the first pixel driving circuit 12A belongs, the second data line D2 belongs to a part of a sub-pixel P to which the fourth pixel driving circuit 12D belongs, the third data line D3 belongs to a part of a sub-pixel P to which the third pixel driving circuit 12C belongs, and the fourth data line D4 belongs to a part of a sub-pixel P to which the fifth pixel driving circuit 12E belongs. That is, in a case where the sub-pixel P to which the first pixel driving circuit 12A belongs is denoted as a first sub-pixel, and the sub-pixel to which the second pixel driving circuit 12B belongs is denoted as a second sub-pixel, and the sub-pixel to which the third pixel driving circuit 12C belongs is denoted as a third sub-pixel, and the sub-pixel to which the fourth pixel driving circuit 12D belongs is denoted as a fourth sub-pixel, and the sub-pixel to which the fifth pixel driving circuit 12E belongs is denoted as a fifth sub-pixel, the first sub-pixel, the third sub-pixel, the fourth sub-pixel, and the fifth sub-pixel belong to a same row of sub-pixels, and the first sub-pixel and the second sub-pixel belong to a same column of sub-pixels. The first sub-pixel, the third sub-pixel, the fourth sub-pixel, and the fifth sub-pixel are sequentially arranged from left to right as: the fourth sub-pixel, the first sub-pixel, the third sub-pixel, and the fifth sub-pixel. The sensing signal line Sense is located between a column where the first sub-pixel is located and a column where the third sub-pixel is located.

In addition, as shown in FIGS. 10, 17, and 18, the driving backplane 1 further includes first connection lines L1 in a same layer as the first electrode C1 of the storage capacitor Cst. The first connection lines L1 and the first gate line G1 and/or the second gate line G2 extend along a substantially same direction. The first insulating layer 100 and the second insulating layer 200 are further provided with a plurality of eighth via holes h8. In the first pixel driving circuit 12A, the third pixel driving circuit 12C, the fourth pixel driving circuit 12D, and the fifth pixel driving circuit 12E, first electrodes 122 of second transistors T2 are each coupled to a respective first connection line L1 through an eighth via hole h8, and the sensing signal line Sense is in contact with first electrodes 122 of second transistors T2 in the first pixel driving circuit 12A and the third pixel driving circuit 12C.

According to the above meaning of the same layer, the first connection lines L1 and the first electrodes C1 of the storage capacitors Cst may be formed through a same patterning process using a mask.

Here, in a case where the driving backplane 1 includes the light-shielding patterns 14, in order to reduce the impedance of the first connection line L1, as shown in FIGS. 17 and 18, optionally, the driving backplane 1 may further include a conductive pattern layer 15 in a same layer as the light-shielding patterns 14 and in direct contact with first connection lines L1.

In these embodiments, the sensing signal line Sense is located between the column where the first sub-pixel is located and the column where the third sub-pixel is located, and is coupled to the second electrodes 123 of the second transistors T2 in the first sub-pixel, the second sub-pixel and the third sub-pixel. The sensing signal line Sense is configured to provide the reset signal and obtain the sensing signal Sense. The reset signal is used to reset anode(s) of driven device(s) 2, and the sensing signal is used to calculate the threshold voltage of the third transistor T3, i.e., a threshold voltage of the node S in the equivalent circuit diagram.

Figure 20:
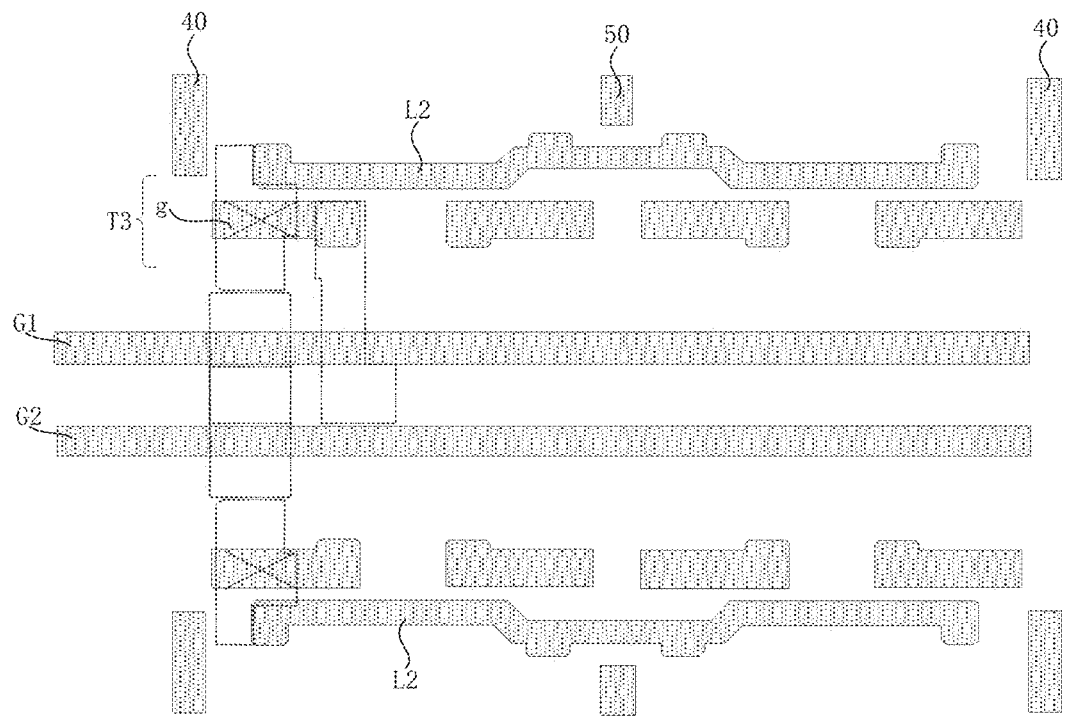
FIG. 20 is a top view showing a structure of a gate metal layer, in accordance with some embodiments.

In some other embodiments, with reference to FIGS. 10, 16 and 20, the power lines ELVDD and the data lines Data are disposed in a same layer, and the power lines ELVDD and the data lines Data extend along a same direction. At least two power lines ELVDD may be provided. The at least two power lines ELVDD include a first power line ELVDD_1 disposed at a side of the fourth pixel driving circuit 12D away from the first pixel driving circuit 12A, and a second power line ELVDD_2 disposed at a side of the fifth pixel driving circuit 12E away from the first pixel driving circuit 12A. The driving backplane 1 further includes second connection lines L2 disposed in a same layer as the first gate line G1 and the second gate line G2. A second connection line L2 is coupled to first electrodes 122 of third transistors T3 in the first pixel driving circuit 12A, the third pixel driving circuit 12C, the fourth pixel driving circuit 12D, and the fifth pixel driving circuit 12E.

According to the above meaning of the same layer, the second connection lines L2 may be formed through a same patterning process using a mask as the first gate lines G1 and the second gate lines G2. In this case, according to a situation that there is the interlayer insulating layer or the interlayer insulating layer and the gate insulating layer between a gate metal layer and a source-drain metal layer, it will be seen that, the second connection line L2 may be coupled to the first electrodes 123 of the third transistors T3 in the first pixel driving circuit 12A, the third pixel driving circuit 12C, the fourth pixel driving circuit 12D, and the fifth pixel driving circuit 12E through respective via holes disposed in the interlayer insulating layer, or, the second connection line L2 may be coupled to the first electrodes 123 of the third transistors T3 in the first pixel driving circuit 12A, the third pixel driving circuit 12C, the fourth pixel driving circuit 12D, and the fifth pixel driving circuit 12E through respective via holes disposed in the interlayer insulating layer and the gate insulating layer.

In yet other embodiments, as shown in FIGS. 10 and 16, in the first pixel driving circuit 12A, the third pixel driving circuit 12C, the fourth pixel driving circuit 12D, and the fifth pixel driving circuit 12E, each of first conductive portions 121b of the third transistors T3 is coupled to a first electrode 122 of a respective third transistor T3 through a second via hole h2, the first power line ELVDD_1 is in contact with a first electrode 122 of a third transistor T3 in the fourth pixel driving circuit 12D, and the second power line ELVDD_2 is in contact with a first electrode 122 of a third transistor T3 in the fifth pixel driving circuit 12E. The first power line ELVDD_1 and the second power line ELVDD_2 may provide power supply voltage signals to the first electrodes 122 of the third transistors T3 in the first pixel driving circuit 12A, the third pixel driving circuit 12C, the fourth pixel driving circuit 12D, and the fifth pixel driving circuit 12E through the second connection line L2.

In these embodiments, as shown in FIG. 16, the first power line ELVDD_1 is disposed at a left side of a column where the fourth sub-pixel is located, and the second power line ELVDD_2 is disposed at a right side of a column where the fifth sub-pixel is located. The four sub-pixels share the two power lines ELVDD.

In some other embodiments, as shown in FIGS. 10 and 16, an orthographic projection of a portion of the fourth pixel driving circuit 12D where a first conductive portion 121b of the third transistor T3 is coupled to a first electrode 122 of the third transistor T3 on the base substrate 11 is located between orthographic projections of the first power line ELVDD_1 and the second connection line L2 on the base substrate 11. An orthographic projection of a portion of the fifth pixel driving circuit 12E where a first conductive portion 121b of the third transistor T3 is coupled to a first electrode 122 of the third transistor T3 on the base substrate 11 is located between orthographic projections of the second power line ELVDD_2 and the second connection line L2 on the base substrate 11. Orthographic projections of portions of the first pixel driving circuit 12A and the third pixel driving circuit 12C where first conductive portions 121b of third transistors T3 are each coupled to a first electrode 122 of a respective third transistor T3 on the base substrate 11 are located at a side of the second connection line L2 proximate to the first gate line G1. It will be seen that, a second via hole h2 in the fourth pixel driving circuit 12D is located between the first power line ELVDD_1 and the second connection line L2, and the first electrode 122 of the third transistor T3 in the fourth pixel driving circuit 12D is in contact with the first power line ELVDD_1 and is coupled to the second connection line L2. A second via hole h2 in the fifth pixel driving circuit 12E is located between the second power line ELVDD_2 and the second connection line L2, and the first electrode 122 of the third transistor T3 in the fifth pixel driving circuit 12E is in contact with the second power line ELVDD_2, and is coupled to the second connection line L2. In this case, orthogonal projections of second via holes h2 in the fourth pixel driving circuit 12D and the fifth pixel driving circuit 12E on the reference side face of the driving backplane 1 may overlap with an orthographic projection of the second connection line L2 on the reference side face of the driving backplane 1. As a result, areas of the fourth pixel driving circuit 12D and the fifth pixel driving circuit 12E may be reduced as much as possible.

In yet other embodiments, as shown in FIGS. 16 and 20, the third transistor T3 further includes a gate electrode g disposed in the same layer as the first gate line G1 and the second gate line G2. The conductive pattern 20 includes a portion 20_1 disposed at a side of the second connection line L2 proximate to the first gate line G1, and a portion 20_2 disposed at a side of the second connection line L2 away from the first gate line G1. The portion 20_1 of the conductive pattern 20 disposed at the side of the second connection line L2 proximate to the first gate line G1 is coupled to the gate electrode g of the third transistor T3 and the second electrode 123 of the first transistor T1. That is, in the equivalent circuit diagram, as shown in FIG. 2, the conductive pattern that is served as the second electrode C2 of the storage capacitor Cst, the gate electrode g of the third transistor T3, and the second electrode of the first transistor T1 may be coupled to the node G. As shown in FIG. 16, the driving backplane 1 further includes first conductive patterns 30 disposed in the same layer as the data lines Data and coupled to respective second electrodes 123 of the first transistors T1. An orthographic projection of the first conductive pattern 30 on the base substrate 11 is located at the side of the second connection line L2 away from the first gate line G1, and the first conductive pattern 30 is coupled to the portion 20_2 of the conductive pattern 20 disposed at the side of the second connection line L2 away from the first gate line G1 through a via hole h9 disposed in the first insulating layer 100.

Figure 21:
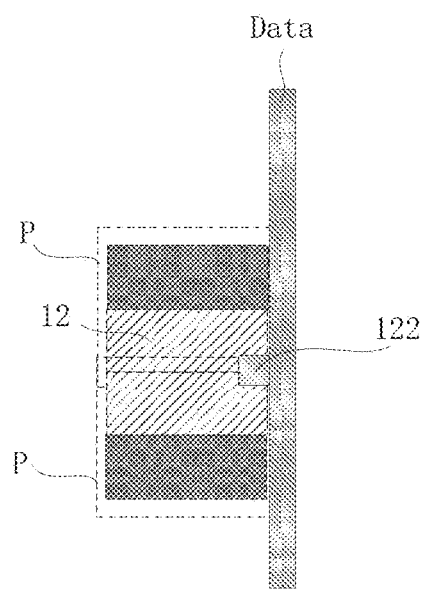
FIG. 21 is a top view showing a structure of a display panel, in accordance with some other embodiments.
Figure 22:
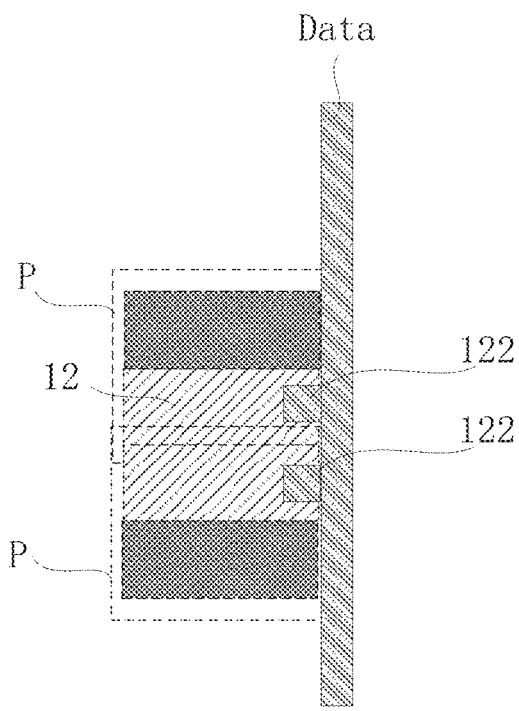
FIG. 22 is a top view showing a structure of a display panel in some other embodiments in the related art.

In these embodiments, in the case where the light emitted by the driven device 2 exits from the base substrate 11, the driven device 2 and the pixel driving circuit 12 may be disposed at two opposite sides of the second connection line L2, respectively. The driven device 2 is disposed at a side of the second connection line L2 away from the first gate line G1, and the pixel driving circuit 12 is disposed at a side of the second connection line L2 proximate to the first gate line G1. That is, in a case where the first pixel driving circuit 12A is mirror-symmetrical to the second pixel driving circuit 12B with respect to the reference straight line X in the driving backplane 1, driven devices 2 in the sub-pixel P to which the first pixel driving circuit 12A belongs and the sub-pixel P to which the second pixel driving circuit 12B belongs are both disposed away from the first gate line G1 and the second gate line G2. In this case, as shown in FIGS. 21 and 22, in two adjacent rows of the sub-pixels P, driven devices 2 in different rows are adjacent, or pixel driving circuits 12 located in different rows are adjacent, so that the first transistors T1 of two adjacent pixel driving circuits 12 share a same first electrode 122, which is different from first transistors T1 of two adjacent pixel driving circuits 12 each having a first electrode 122 in the related art. A region where the pixel driving circuit 12 is located and a region where the driven device 2 is located may both be in a shape of a rectangle, and regions where the pixel driving circuits 12 and the driven devices 2 are located are also in a shape of a rectangle as a whole.

In addition, similar to a situation that the orthogonal projections of the second via holes h2 in the fourth pixel driving circuit 12D and the fifth pixel driving circuit 12E on the reference side face of the driving backplane 1 may overlap with the orthographic projection of the second connection line L2 on the reference side face of the driving backplane 1, as shown in FIG. 16, orthogonal projections of the second via holes h2 in the third pixel driving circuit 12C and the first pixel driving circuit 12A on the reference side face of the driving backplane 1 may also overlap with the orthographic projection of the second connection line L2 on the reference side face of the driving backplane 1. As a result, it may also be possible to reduce areas of the third pixel driving circuit 12C and the first pixel driving circuit 12A as much as possible. In this case, portions of the second connection line L2 corresponding to the first pixel driving circuit 12A and the third pixel driving circuit 12C may be bent to a side of the second connection line L2 away from the first gate line G1 with respect to other portions, and bypass the second via holes h2 in the third pixel driving circuit 12C and the first pixel driving circuit 12A, which may also prevent channel lengths of the third transistors T3 in the third pixel driving circuit 12C and the first pixel driving circuit 12A from being too large.

In some embodiments, as shown in FIGS. 16 and 20, the driving backplane 1 further includes two second conductive patterns 40 and a third conductive pattern 50 disposed in the same layer as the first gate lines G1 and the second gate lines G2. One of the two second conductive patterns 40 is coupled to the first power line ELVDD_1, the other second conductive pattern 40 is coupled to the second power line ELVDD_2, and the third conductive pattern 50 is coupled to the sensing signal line Sense. The same layer here may be referred to the above explanation of the same layer, which will not be repeated herein. Here, by providing the second conductive patterns 40 and the third conductive pattern 50, the impedance of the first power line ELVDD_1, the second power line ELVDD_2, and the sensing signal line Sense may be reduced.

In some embodiments, as shown in FIG. 16, the first pixel driving circuit 12A and the third pixel driving circuit 12C may be mirror-symmetrical with respect to the sensing signal line Sense, the fourth pixel driving circuit 12D and the fifth pixel driving circuit 12E may be mirror-symmetrical with respect to the sensing signal line Sense, the second connection line L2 may be mirror-symmetrical with respect to the sensing signal line Sense, and the first connection lines L1 may be mirror-symmetrical with respect to the sensing signal line Sense. As a result, an area of the pixel driving circuits 12 may be reduced to a greatest extent, and the PPI may be improved.

In a case where the specific structures of the pixel driving circuits 12 are determined, the positional relation between the gate driver circuit 13 and the pixel driving circuits 12 will be described in detail below by considering the shift registers described above as an example.

Referring to FIGS. 4 and 6, the plurality of transistors included in the N-th-stage shift register 130 and the (N+1)-th-stage shift register 130 are all, for example, referred to as thin film transistors. A plurality of thin film transistors included in each stage of shift register 130 may be divided into a plurality of thin film transistor groups 132, and each thin film transistor group 132 includes at least one thin film transistor. For example, each sub-circuit included in the N-th-stage shift register 130 includes at least one thin film transistor group 132.

Figure 23:
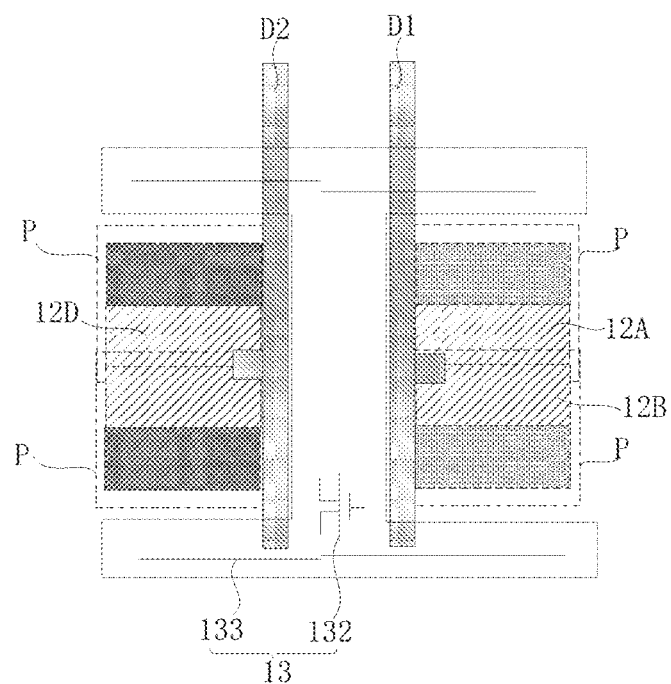
FIG. 23 is a diagram showing a relative position between a region where a gate driver circuit is located and a region where sub-pixels are located, in accordance with some embodiments.

In some embodiments, as shown in FIG. 23, at least one thin film transistor group 132 in the gate driver circuit 13 is disposed between adjacent sub-pixels P in the same row of sub-pixels P.

According to a situation that each pixel driving circuit 12 belongs to a respective sub-pixel P, and in the direction along which the first gate lines G1 extend, the third pixel driving circuit 12C and the fourth pixel driving circuit 12D are adjacent to the first pixel driving circuit 12A, and the fifth pixel driving circuit 12E is adjacent to the third pixel driving circuit 12C, it will be seen that, the third pixel driving circuit 12C, the fourth pixel driving circuit 12D, the first pixel driving circuit 12A, and the fifth pixel driving circuit 12E all belong to the same row of sub-pixels P. Here, in an example where at least one thin film transistor group 132 in the gate driver circuit 13 is disposed between the sub-pixel P to which the first pixel driving circuit 12A belongs and the sub-pixel P to which the fourth pixel driving circuit 12D belongs, as shown in FIG. 16, portions of the first data line D1 and the second data line D2 corresponding to the first pixel driving circuit 12A and the fourth pixel driving circuit 12D may be regarded as portions of the first pixel driving circuit 12A and the fourth pixel driving circuit 12D, respectively. In this case, at least one thin film transistor group 132 in the gate driver circuit 13 may be disposed between the first data line D1 and the second data line D2.

Of course, in a case where the sub-pixel P to which the fourth pixel driving circuit 12D belongs is a first sub-pixel P in the row of sub-pixels P, and the sub-pixel P to which the fifth pixel driving circuit 12E belongs is a last sub-pixel P in the row of sub-pixels P, the two sub-pixels P will inevitably be adjacent to the non-display area, and thin film transistor group(s) 132 may be disposed in positions between the two sub-pixels P and the non-display area. Therefore, a special situation where a first sub-pixel P and a last sub-pixel P in each row are adjacent to the non-display area cannot be excluded just because the thin film transistor group(s) 132 are located between adjacent sub-pixels are defined in the embodiments of the present disclosure.

Figure 24:
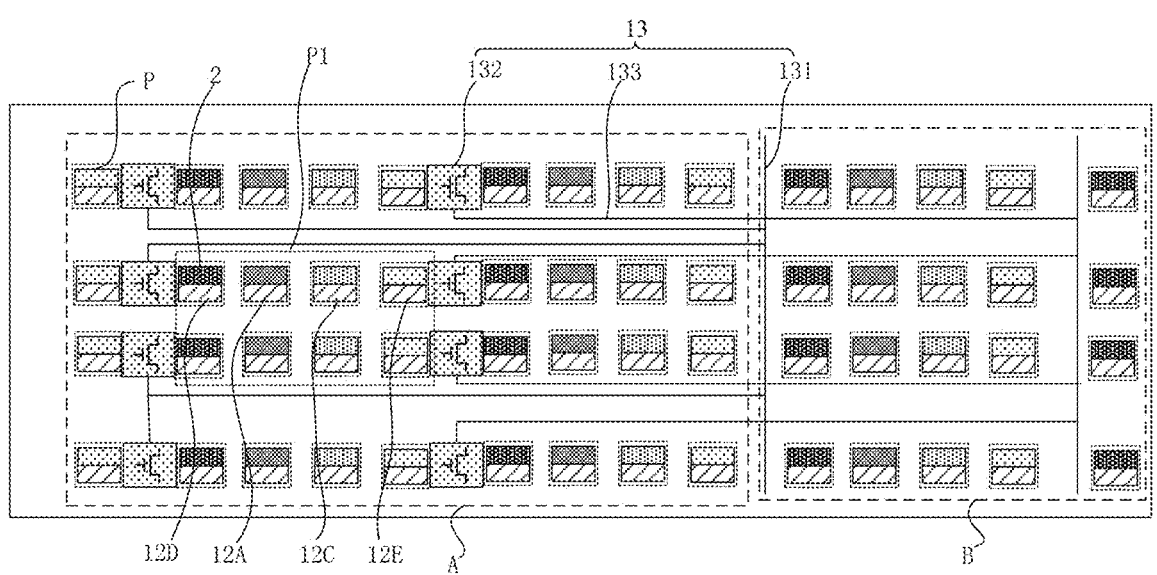
FIG. 24 is a diagram showing a relative position between a region where a gate driver circuit is located and a region where sub-pixels are located, in accordance with some other embodiments.

In some embodiments, as shown in FIG. 24, each thin film transistor group 132 in a shift register 130 is located between corresponding two adjacent sub-pixels P.

Thin film transistor groups 132 included in the shift register 130 are each located between corresponding adjacent sub-pixels P in the same row of sub pixels P, and there is at least one sub-pixel P between at least two thin film transistor groups 132.

All the thin film transistor groups 132 included in each stage of shift register 130 are located between adjacent sub-pixels P in the same row of sub-pixels P, and there is only one thin film transistor group 132 between two adjacent sub-pixels P in the same row of sub-pixels P at most. For example, in a case where there are a large number of sub-pixels P in the same row, the thin film transistor groups 132 may be provided only between some of the adjacent sub-pixels P. As a result, for two adjacent thin film transistor groups 132, there may be one sub-pixel P or multiple sub-pixels P between the two thin film transistor groups 132.

In this case, an area occupied by the gate driver circuit 13 in the non-display area may be reduced to the greatest extent, so as to achieve the narrow bezel of the driving backplane.

In some embodiments, as shown in FIG. 24, the plurality of sub-pixels P may be divided into a plurality of display units P1, and each display unit P1 may include at least two sub-pixels P. For example, each display unit P1 includes eight sub-pixels P, such as the sub-pixel P to which the first pixel driving circuit 12A belongs, the sub-pixel P to which the third pixel driving circuit 12C belongs, the sub-pixel P to which the fourth pixel driving circuit 12D belongs, and the sub-pixel P to which the fifth pixel driving circuit 12E belongs, and four sub-pixels P that are mirror-symmetrical to the four sub-pixels with respect to the reference straight line X. In this case, at least one thin film transistor group 132 included in each stage of shift register 130 is located between adjacent display units P1 in a same row of display units P1, and in a case where all the thin film transistor groups 132 included in each stage of shift register 130 are located between adjacent display units P1 in the same row of display units P1, there is only one thin film transistor group 132 between two adjacent display units P1 in the same row of display units P1 at most.

Based on this, in some embodiments, at least one control signal line 131 in the gate driver circuit 13 is disposed between two adjacent columns of sub-pixels P or two adjacent columns of display units P1. A column of sub-pixels P includes sub-pixels P with a same ordinal value in all rows of sub-pixels P, and a column of display units P1 includes display units P1 with a same ordinal value in all rows of display units P1.

For example, still in an example where the display unit P1 includes the eight sub-pixels P described above, two adjacent columns of display units P1 include two adjacent display units P1 in each row of display units P1.

In a case where the at least one of the plurality of control signal lines 131 is located between two adjacent columns of sub-pixels P or two adjacent columns of display units P1, it is beneficial to further achieve the narrow bezel of the driving backplane 1.

In some embodiments, in a case where at least two control signal lines 131 are disposed between two adjacent columns of sub-pixels P or two adjacent columns of display units P1, there is at least one sub-pixel P or at least one display unit P1 between any two of the at least two control signal lines 131.

For example, in a case where there are at least two control signal lines 131, the control signal lines 131 extend in a column direction of the plurality of sub-pixels P, and are arranged in a row direction of the plurality of sub-pixels P; or, the control signal lines 131 extend in a column direction of the plurality of display units P1, and are arranged in a row direction of the plurality of display units P1.

For example, the plurality of display units P1 are arranged in a matrix with multiple rows and multiple columns, and two adjacent columns of display units P1 are provided therebetween with only one control signal line 131. In an respect, since the control signal lines 131 need to be coupled to thin film transistor groups 132, and different control signal lines 131 may need to be coupled to different thin film transistor groups 132, by providing only one control signal line 131 between two adjacent columns of display units P1, so as to disperse the plurality of control signal lines 131, it is possible to facilitate the coupling between the control signal lines 131 and the thin film transistor groups 132, and make full use of regions that are each between two adjacent columns of display units P1. In another aspect, in a case where multiple control signal lines 131 are disposed between two adjacent columns of display units P1, for example, in a case where three control signal lines 131 are located between two adjacent columns of display units P1, a distance between the two adjacent columns of display units P1 will increase; moreover, in a case where the display units P1 are spaced apart from each other in the display panel, the distance between any two adjacent columns of display units P1 will be large, thereby reducing pixels per inch (PPI) of the display panel. However, in the embodiments of the present disclosure, there is only one control signal line 131 between two adjacent columns of display units P1, which may ensure that the display panel has a high pixel density.

In some embodiments, referring to FIGS. 23 and 24, in a case where at least two thin film transistor groups 132 are disposed between two adjacent sub-pixels P in a same row of sub-pixels P or a same row of display units P1, or disposed between two adjacent display units P1, there is no control signal line 131 between any two thin film transistor groups 132.

When the gate driver circuit 13 is arranged, all the thin film transistor groups 132 and all the control signal lines 131 are disposed in a region A and a region B, respectively. In the region A where the thin film transistor groups 132 are located, there is no control signal line 131. On the contrary, in the region B where the control signal lines 131 are located, there is no thin film transistor group 132, so that a layout of the gate driver circuit 13 is more concise and clear.

In some embodiments, referring to FIG. 24, a control signal line 131 coupled to a thin film transistor group 132 and the thin film transistor group 132 are not provided therebetween with other thin film transistor groups 132 and/or other control signal lines 131.

The control signal line 131 coupled to the thin film transistor group 132 is disposed near the thin film transistor group 132, which facilitates the coupling of the thin film transistor group 132 with the control signal line 131, so as to help to shorten a length of a connection line therebetween, and to help to reduce the number of connection lines located between two rows of sub-pixels P, and to reduce a distance between two adjacent rows of sub-pixels P, thereby helping to achieve the high PPI of the display panel.

In some embodiments, as shown in FIGS. 23 and 24, each thin film transistor group 132 and each control signal line 131 are provided therebetween with at least one sub-pixel P or at least one display unit P1.

Since each thin film transistor group 132 and each control signal line 131 are provided therebetween with at least one sub-pixel P or at least one display unit P1, a thin film transistor group 132 and a portion of a control signal line 131 are not disposed between adjacent sub-pixels P or adjacent display units P1 together.

For example, referring to FIGS. 24, in a case where the gate driver circuit 13 is arranged, thin film transistor groups 132 included in each stage of shift register 130 are disposed in a region of the driving backplane, such as the region A; the control signal lines 131 are disposed in another region of the driving backplane 1, such as the region B.

The region A and the region B are adjacent to each other. The thin film transistor groups 132 located in the region A and the control signal lines 131 located in the region B are coupled together.

For another example, referring to FIG. 24, in the case where the gate driver circuit 13 is arranged, thin film transistor groups 132 coupled to a same control signal line 131 in each row of sub-pixels P or each row of display units P1 are disposed near the control signal line 131, and each control signal line 131 and thin film transistor groups 132 coupled to the control signal line 131 are not provided therebetween other thin film transistor groups 132 and/or other control signal lines 131.

Each thin film transistor group 132 and each control signal line 131 are provided therebetween at least one sub-pixel P or at least one display unit P1. That is, sub-pixels P or display units P1 between which the thin film transistor group 132 is located are at least partially different from sub-pixels P or display units P1 between which the control signal line 131 is located. In one aspect, a distance between adjacent sub-pixels P or adjacent display units P1 may be fully utilized. In another aspect, it may be possible to prevent the PPI of the display panel from being reduced due to a large distance between adjacent sub-pixels P or adjacent display units P1.

In some embodiments, as shown in FIGS. 23 and 24, the gate driver circuit 13 further includes a plurality of connection lines 133 located between two adjacent rows of sub-pixels P or two adjacent rows of display units P1. At least two thin film transistor groups are coupled through a respective connection line 133. Alternatively, a control signal line 131 and at least one thin film transistor group 132 are coupled through a respective connection line. The connection lines 133 are used to achieve the coupling between thin film transistor groups 132 and the coupling between the thin film transistor group(s) 132 and the control signal line 131.

For example, referring to FIGS. 23 and 24, a plurality of connection lines 133 are provided between two adjacent rows of sub-pixels P or two adjacent rows of display units P1. Thin film transistor groups 132 in the shift registers 130 are sequentially arranged, for example, in the region A. The plurality of control signal lines 131 are sequentially arranged, for example, in the region B. A description that the thin film transistor groups 132 are sequentially arranged means that, there is no control signal line 131 between two thin film transistor groups 132. A description that the plurality of control signal lines 131 are sequentially arranged means that, there is no thin film transistor group 132 between two control signal lines 131. In this structure, the region A where the thin film transistor groups 132 are located is adjacent to the region B where the control signal lines 131 are located, so that the layout of the gate driver circuit 13 is relatively concise and clear.

In some embodiments, referring to FIGS. 23 and 24, in a case where the sub-pixel to which the first pixel driving circuit 12A belongs and the sub-pixel to which the second pixel driving circuit 12B belongs are both located away from the first gate line G1 and the second gate line G2, in two adjacent rows of sub-pixels P, driven devices 2 in different rows are adjacent, or pixel driving circuits 12 in different rows are adjacent. In a case where the gate driver circuit 13 includes the plurality of connection lines 133, multiple connection lines 133 are located between driven devices 2 in different rows of two other adjacent rows of sub-pixels P.

That is, the connection lines 133 are located between two adjacent rows of display units P1. In this structure, connection lines 133 coupled to thin film transistor groups 132 in two adjacent rows may be adjacent, which is conducive to providing the connection lines 133, so that the wiring of the gate driver circuit 13 is clearer.

Based on this, in some embodiments, referring to FIGS. 23 and 24, shift registers 130 in two adjacent rows share at least one of the plurality of connection lines 133. The thin film transistor groups 132 in two adjacent rows share same connection lines 133, so that a distance between two adjacent rows of display units P1 may be reduced, and the PPI of the display panel may be improved.

For another example, thin film transistor group(s) 132 coupled to a same control signal line 131 are disposed near the control signal line 131, so that only one corresponding connection line 133 needs to be disposed between two adjacent rows of display units P1. As a result, it may be possible to reduce the distance between two adjacent rows of display units P1, which is beneficial to improve the PPI of the display panel.

It will be noted that, although FIGS. 23 and 24 only illustrate that the connection line 133 are used for connecting the thin film transistor group 132 to the control signal line 131, and not illustrate that the connection line 133 may also be used to connect two thin film transistor groups 132, a connection function of the connection line 133 is not limited by these accompanying drawings, and the connection line 133 may also be used to connect two thin film transistor groups 132.

According to the specific layout of the thin film transistor groups 132 and the control signal lines 131 in the display panel, by flexibly arranging the positions and the number of the connection lines 133, two thin film transistor groups 132 may be coupled, and a thin film transistor group 132 and a control signal line 131 may be coupled.

Figure 15:
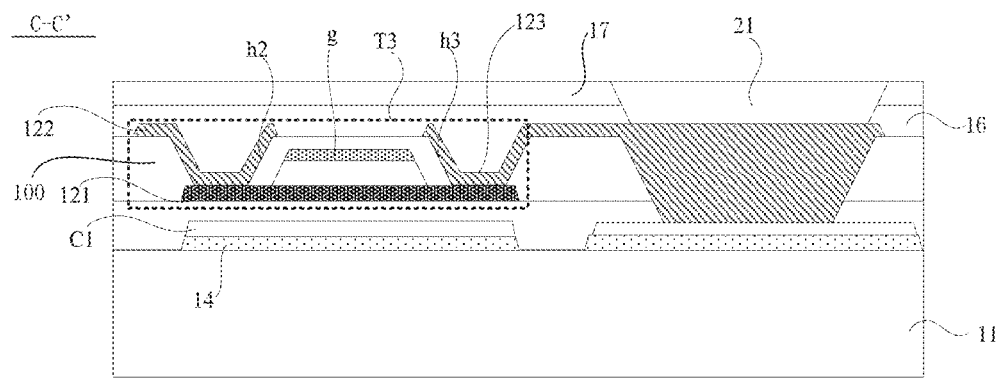
FIG. 15 is a structural sectional view taken along the C-C' direction in FIG. 12 in the related art.

Regardless of whether the display panel 1 is a bottom-emission display panel or a top-emission display panel, a structure of the display panel is, for example, as shown in FIG. 15. In a thickness direction of the display panel 1, besides the active layer pattern (e.g., the active layer 121 of the third transistor T3 in FIG. 15), the first insulating layer 100, the light-shielding patterns 14, the first electrodes C1 of the storage capacitors Cst, the second insulating layer 200, the gate metal layer (e.g., the gate electrode g of the third transistor T3 in FIG. 15), and the SD layer (e.g., the first electrode 122 and the second electrode 123 of the third transistor T3) that are disposed on the base substrate 11, the display panel 1 may further include a passivation layer 16, a planarization layer 17, anodes 21, etc.

The active layer pattern is, for example, made of metal oxide, polysilicon, or amorphous silicon. The metal oxide is, for example, indium gallium zinc oxide.

The gate metal layer is, for example, made of metal, such as molybdenum, titanium, copper, silver, or aluminum, and the structure thereof is, for example, a single-layered structure.

The SD layer is, for example, made of a metal material, such as molybdenum, titanium, copper, silver, or aluminum, and the structure thereof may be a single-layered structure or a laminated structure.

The passivation layer 16, the first insulating layer 100 and the second insulating layer 200 are all, for example, made of inorganic insulating materials, such as at least one of silicon oxide ($SiO_x$) and silicon nitride (SiN).

The planarization layer 17 is, for example, made of an organic substance, such as polyimide (PI), and the planarization layer has a planarization effect.

The foregoing descriptions are merely specific implementation manners of the present disclosure, but the protection scope of the present disclosure is not limited thereto. Any person skilled in the art could conceive of changes or replacements within the technical scope of the present disclosure, which shall be included in the protection scope of the present disclosure. Therefore, the protection scope of the present disclosure shall be subject to the protection scope of the claims.

What is claimed is:

1. A driving backplane, comprising:
a base substrate;
a plurality of data lines, and a first gate line and a second gate line that are adjacent, all of which are disposed on the base substrate; and
a plurality of pixel driving circuits disposed on the base substrate, each pixel driving circuit including a first transistor, the first transistor including an active layer, the active layer including an active portion, a first conductive portion and a second conductive portion;
active layers of first transistors in the plurality of pixel driving circuits further including first contact portions;
the plurality of pixel driving circuits including a first pixel driving circuit coupled to a data line of the plurality of data lines and the first gate line, and a second pixel driving circuit coupled to the data line of the plurality of data lines and the second gate line,
wherein a first conductive portion of a first transistor included in the first pixel driving circuit and a first conductive portion of a first transistor included in the second pixel driving circuit are in contact through a first contact portion of the first contact portions, and are coupled to the data line of the plurality of data lines through the first contact portion.

2. The driving backplane according to claim 1, wherein the plurality of pixel driving circuits include an active layer pattern, and the active layer of the first transistor belongs to the active layer pattern;
the driving backplane further comprises a first insulating layer disposed between the active layer pattern and the plurality of data lines, wherein the first insulating layer is provided with a plurality of first via holes; and
the first contact portion is coupled to the data line of the plurality of data lines through a respective first via hole.

3. The driving backplane according to claim 1, wherein an orthographic projection of at least one of the first gate line and the second gate line on a plane where a reference side face of the driving backplane is located does not overlap with an orthographic projection of the first contact portion on the plane where the reference side face of the driving backplane is located, and the reference side face of the driving backplane is a side face of the driving backplane parallel to the data line of the plurality of data lines.

4. The driving backplane according to claim 3, wherein a portion of the first gate line located between the first pixel driving circuit and the second pixel driving circuit, and a portion of the second gate line located between the first pixel driving circuit and the second pixel driving circuit are both straight lines.

5. The driving backplane according to claim 1, wherein the first pixel driving circuit is mirror-symmetrical to the second pixel driving circuit with respect to a reference straight line, and the reference straight line is a line that is perpendicular to the data line of the plurality of data lines and passes through first conductive portions of first transistors in the first pixel driving circuit and the second pixel driving circuit.

6. The driving backplane according to claim 1, wherein each pixel driving circuit further includes a second transistor, the second transistor includes an active layer disposed in a same layer as the active layer of the first transistor, and the active layer of the second transistor includes an active portion, a first conductive portion and a second conductive portion, active layers of second transistors in the plurality of pixel driving circuits further including second contact portions; and
a first conductive portion of a second transistor included in the first pixel driving circuit is in contact with a first conductive portion of a second transistor included in the second pixel driving circuit through a second contact portion of the second contact portions, and the second contact portion is located between the first gate line and the second gate line.

7. The driving backplane according to claim 6, wherein the plurality of pixel driving circuits include an active layer pattern, and the active layer of the first transistor belongs to the active layer pattern;
the driving backplane further comprises a first insulating layer disposed between the active layer pattern and the plurality of data lines, the first insulating layer is provided with a plurality of first via holes, and the first contact portion is coupled to the data line of the plurality of data lines through a respective first via hole;
the second transistor further includes a first electrode and a second electrode that are disposed in a same layer as the plurality of data lines;
each pixel driving circuit further includes a third transistor and a storage capacitor, the third transistor includes an active layer disposed in a same layer as the active layer of the first transistor, and a first electrode and a second electrode that are disposed in a same layer as the plurality of data lines; the active layer of the third transistor includes an active portion, a first conductive portion, and a second conductive portion; the storage capacitor includes a first electrode and a second electrode; the first electrode of the storage capacitor is located at a side of the active layer of the first transistor proximate to the base substrate;
the first insulating layer is further provided with a plurality of second via holes, a plurality of third via holes, a plurality of fourth via holes, a plurality of fifth via holes, and a plurality of sixth via holes;
the first electrode of the third transistor is connected to a power line in at least one power line, and is coupled to the first conductive portion of the third transistor through a second via hole, the second electrode of the third transistor is coupled to the second conductive portion of the third transistor through a third via hole;
the first electrode of the second transistor is coupled to the first conductive portion of the second transistor through a fourth via hole, and the second electrode of the second transistor is coupled to the second conductive portion of the second transistor through a fifth via hole;
the driving backplane further comprises a second insulating layer disposed between active layers of first transistors and first electrodes of storage capacitors, the second insulating layer is provided with a plurality of seventh via holes, and each seventh via hole is communicated with a respective sixth via hole; and
the first electrode of the storage capacitor is coupled to a second electrode of a respective second transistor and/ or a second electrode of a respective third transistor through both a sixth via hole and a seventh via hole communicated with the sixth via hole,
wherein an orthogonal projection of the sixth via hole on the base substrate does not overlap with orthogonal projections of the third via hole and the fifth via hole on the base substrate.

8. The driving backplane according to claim 7, further comprising light-shielding patterns disposed on the base substrate,
wherein the first electrodes of the storage capacitors are transparent electrodes, the light-shielding patterns are disposed at a side of the first electrodes of the storage capacitors proximate to the base substrate, and are in direct contact with respective first electrodes of the storage capacitors.

9. The driving backplane according to claim 7, wherein second electrodes of the storage capacitors in the plurality of pixel driving circuits are conductive patterns in a same layer as the active layer of the first transistor.

10. The driving backplane according to claim 7, further comprising:
a third pixel driving circuit and a fourth pixel driving circuit that are adjacent to the first pixel driving circuit in a. direction along which the first gate line extends, a fifth pixel dtiving circuit adjacent to the third pixel driving circuit in the direction along which the first gate line extends, and a sensing signal line disposed between the third pixel driving circuit and the first pixel driving circuit,
wherein the plurality of data lines includes:
a first data line and a second data line that are disposed between the first pixel driving circuit and the fourth pixel driving circuit, and a third data line and a fourth data line that are disposed between the fifth pixel driving circuit and the third pixel driving circuit, the sensing signal line is disposed in a same layer as the plurality of data lines;
the first data line is coupled to the first conductive portion of the first transistor in the first pixel driving circuit, the second data line is coupled to a first conductive portion of a first transistor in the fourth pixel driving circuit, the third data line is coupled to a first conductive portion of a first transistor in the third pixel driving circuit, and the fourth data line is coupled to a first conductive portion of a first transistor in the fifth pixel driving circuit;
the driving backplane further comprising first connection lines in a same layer as the first electrode of the storage capacitor, and the first connection lines and the first gate line and/or the second gate line extending along a substantially same direction,
wherein the first insulating layer and the second insulating layer are further provided with a plurality of eighth via holes; and
in the first pixel driving circuit, the third pixel driving circuit, the fourth pixel driving circuit, and the fifth pixel driving circuit, first electrodes of second transistors are each coupled to a respective first connection line through an eighth via hole, and the sensing signal line is in contact with first electrodes of second transistors in the first pixel driving circuit and the third pixel driving circuit.

11. The driving backplane according to claim 10, wherein the at least one power line includes at least two power lines, the at least two power lines are disposed in a same layer as the plurality of data lines, and the at least two power lines and the plurality of data lines extend along a same direction; and
the at least two power lines include a first power line disposed at a side of the fourth pixel driving circuit away from the first pixel driving circuit, and a second power line disposed at a side of the fifth pixel driving circuit away from the first pixel driving circuit;
the driving backplane further comprises second connection lines disposed in a same layer as the first gate line and the second gate line, wherein a second connection line is coupled to first electrodes of third transistors in the first pixel driving circuit, the third pixel driving circuit, the fourth pixel driving circuit and the fifth pixel driving circuit; and
the first power line is in contact with a first electrode of a third transistor in the fourth pixel driving circuit, and the second power line is in contact with a first electrode of a third transistor in the fifth pixel driving circuit.

12. The driving backplane according to claim 11, wherein an orthographic projection of a portion of the fourth pixel driving circuit where a first conductive portion of the third transistor is coupled to a first electrode of the third transistor on the base substrate is located between orthographic projections of the first power line and the second connection line on the base substrate, and an orthographic projection of a portion of the fifth pixel driving circuit where a first conductive portion of the third transistor is coupled to a first electrode of the third transistor on the base substrate is located between orthographic projections of the second power line and the second connection line on the base substrate; and
orthographic projections of portions of the first pixel driving circuit and the third pixel driving circuit where first conductive portions of third transistors are each coupled to a first electrode of a. respective third transistor on the base substrate are located at a side of the second connection line proximate to the first gate line.

13. The driving backplane according to claim 11, wherein the third transistor further includes a gate electrode disposed in the same layer as the first gate line and the second gate line;
second electrodes of the storage capacitors in the plurality of pixel driving circuits are conductive patterns in a same layer as the active layer of the first transistor, a conductive pattern includes a portion disposed at a side of the second connection line proximate to the first gate line, and a portion disposed at a side of the second connection line away from the first gate line, wherein
the portion of the conductive pattern disposed at the side of the second connection line proximate to the first gate line is coupled to the gate electrode of the third transistor and the second electrode of the first transistor;
the driving backplane further comprises first conductive patterns disposed in a same layer as the plurality of data lines and coupled to respective second electrodes of the first transistors; and
an orthographic projection of a first conductive pattern on the base substrate is located at the side of the second connection line away from the first gate line, and the first conductive pattern is coupled to the portion of the conductive pattern disposed at the side of the second connection line away from the first gate line through a via hole disposed in the first insulating layer.

14. The driving backplane according to claim 13, further comprising two second conductive patterns and a third conductive pattern that are disposed in a same layer as the first gate line and the second gate line,
- wherein one of the two second conductive patterns is coupled to the first power line, another second conductive pattern is coupled to the second power line, and the third conductive pattern is coupled to the sensing signal line.

15. The driving backplane according to claim 10, wherein the first pixel driving circuit and the third pixel driving circuit are mirror-symmetrical with respect to the sensing signal line, and the fourth pixel driving circuit and the fifth pixel driving circuit are mirror-symmetrical with respect to the sensing signal line.

16. The driving backplane according to claim 1, further comprising a gate driver circuit,
- wherein each pixel driving circuit belongs to a respective sub-pixel of a plurality of rows of sub-pixels of the driving backplane;
- the gate driver circuit includes a plurality of shift registers that are cascaded;
- each shift register includes at least one thin film transistor group, each thin film transistor group includes at least one thin film transistor; and
- at least one thin film transistor group in the gate driver circuit is disposed between adjacent sub-pixels or adjacent display units in a same row of sub-pixels, and each display unit includes at least two sub-pixels.

17. The driving backplane according to claim 16, wherein the gate driver circuit further includes a plurality of control signal lines, at least part of the plurality of control signal lines are coupled to the shift register, and are configured to provide control signals to the shift register;
- a column of sub-pixels includes sub-pixels with a same ordinal value in the plurality of rows of sub-pixels; and
- at least two control signal lines are disposed between adjacent columns of sub-pixels or between adjacent columns of display units, at least one sub-pixel or at least one display unit is disposed between any two of the at least two control signal lines, and each thin film transistor group and each control signal line are provided therebetween with at least one sub-pixel or at least one display unit; or
- the gate driver circuit thrther includes a plurality of control signal lines, at least part of the plurality of control signal lines are coupled to the shift register, and are configured to provide control signals to the shift register;
- a column of sub-pixels includes sub-pixels with a same ordinal value in the plurality of rows of sub-pixels;
- at least two control signal lines are disposed between adjacent columns of sub-pixels or between adjacent columns of display units, at least one sub-pixel or at least one display unit is disposed between any two of the at least two control signal lines, and each thin film transistor group and each control signal line are provided therebetween with at least one sub-pixel or at least one display unit;
- the gate driver circuit further includes a plurality of connection lines located between sub-pixels in two adjacent rows or display units in two adjacent rows;
- at least two thin film transistor groups are coupled through a respective connection line; or the control signal line is coupled to at least one thin film transistor group through a respective connection line; and
- shift registers in two adjacent rows share at least one of the plurality of connection lines.

18. A display panel, comprising:
- the driving backplane according to claim 1; and
- driven devices, each pixel driving circuit being coupled to a respective driven device.

19. The display panel according to claim 18, wherein the display panel is a top-emission display panel; or the display panel is a bottom-emission display panel, and first electrodes of storage capacitors in pixel driving circuits in the driving backplane are transparent electrodes, and an orthographic projection of a first electrode of the first electrodes on the base substrate overlaps with an orthographic projection of a respective driven device on the base substrate; or
- the first pixel driving circuit is mirror-symmetrical to the second pixel driving circuit with respect to a reference straight line in the driving backplane, a driven device in a sub-pixel to which the first pixel driving circuit belongs is disposed away from the first gate line and the second gate line with respect to the first pixel driving circuit, and a. driven device in a sub-pixel to which the second pixel driving circuit belongs is disposed away from the first gate line and the second gate line with respect to the second pixel driving circuit.

20. A display apparatus, comprising the display panel according to claim 18.

* * * * *